(12) United States Patent
Cha et al.

(10) Patent No.: US 12,245,475 B2
(45) Date of Patent: Mar. 4, 2025

(54) DISPLAY DEVICE AND MANUFACTURING METHOD THEREOF

(71) Applicant: Samsung Display Co., Ltd., Yongin-si (KR)

(72) Inventors: Myoung Geun Cha, Seoul (KR); Sang Gun Choi, Suwon-si (KR); Tae Wook Kang, Seongnam-si (KR); Bum Mo Sung, Hanam-si (KR); Yun Jung Oh, Anyang-si (KR); Yong Su Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 425 days.

(21) Appl. No.: 17/687,702

(22) Filed: Mar. 7, 2022

(65) Prior Publication Data

US 2022/0399428 A1    Dec. 15, 2022

(30) Foreign Application Priority Data

Jun. 14, 2021 (KR) ........................ 10-2021-0076799

(51) Int. Cl.
| | | |
|---|---|---|
| *H01L 21/40* | (2006.01) | |
| *H10K 50/814* | (2023.01) | |
| *H10K 50/824* | (2023.01) | |
| *H10K 59/122* | (2023.01) | |
| *H10K 59/131* | (2023.01) | |
| *H10K 71/00* | (2023.01) | |
| *H10K 59/12* | (2023.01) | |

(52) U.S. Cl.
CPC ......... *H10K 59/131* (2023.02); *H10K 50/814* (2023.02); *H10K 50/824* (2023.02); *H10K 59/122* (2023.02); *H10K 71/00* (2023.02); *H10K 59/1201* (2023.02)

(58) Field of Classification Search
CPC .. H10K 59/131; H10K 50/814; H10K 50/824; H10K 59/122; H10K 71/00; H10K 59/1201; H10K 59/32; H10K 59/80516; H10K 59/80522; H10K 59/123
USPC .......................................................... 257/40
See application file for complete search history.

(56) References Cited

U.S. PATENT DOCUMENTS

| | | | |
|---|---|---|---|
| 9,570,471 B2 * | 2/2017 | Heo ..................... | H01L 27/1225 |
| 9,748,318 B2 * | 8/2017 | Shim ................ | H10K 59/80522 |
| 9,859,520 B2 | 1/2018 | Kim | |
| 9,947,733 B2 * | 4/2018 | Jang ..................... | H10K 50/824 |
| 10,177,206 B2 * | 1/2019 | Jung ..................... | H10K 71/00 |
| 10,181,573 B2 * | 1/2019 | Im .......................... | H10K 50/84 |
| 10,388,905 B2 * | 8/2019 | Choi .................... | H10K 59/122 |
| 10,707,293 B2 * | 7/2020 | Takechi ................ | H01L 27/124 |

(Continued)

FOREIGN PATENT DOCUMENTS

| | | |
|---|---|---|
| KR | 10-2009-0066223 | 6/2009 |
| KR | 10-2016-0062646 | 6/2016 |
| KR | 10-2017-0072726 | 6/2017 |

*Primary Examiner* — Vu A Vu

(74) *Attorney, Agent, or Firm* — KILE PARK REED & HOUTTEMAN PLLC

(57) ABSTRACT

A display device includes: a substrate; a transistor disposed on the substrate; a first electrode connected to the transistor; an emission layer disposed on the first electrode; a second electrode disposed on the emission layer; a common voltage line connected to the second electrode; and a third electrode and a fourth electrode disposed between the common voltage line and the second electrode.

30 Claims, 20 Drawing Sheets

(56) References Cited

U.S. PATENT DOCUMENTS

| | | | |
|---|---|---|---|
| 11,574,985 B2* | 2/2023 | Koh | H10K 59/131 |
| 11,751,415 B2* | 9/2023 | Chang | H10K 85/00 |
| | | | 428/690 |
| 11,997,864 B2* | 5/2024 | Wang | H10K 71/40 |
| 2021/0202655 A1 | 7/2021 | Cho et al. | |

* cited by examiner

DISPLAY DEVICE AND MANUFACTURING METHOD THEREOF

CROSS-REFERENCE TO RELATED APPLICATION

This application claims priority from and the benefit of Korean Patent Application No. 10-2021-0076799, filed on Jun. 14, 2021, which is hereby incorporated by reference for all purposes as if fully set forth herein.

BACKGROUND

Field

Embodiments of the invention relate generally to a display device and a manufacturing method thereof and more specifically, to a display device having a common voltage line connected to auxiliary electrodes and a manufacturing method thereof.

Discussion of the Background

A display device is a device for displaying an image, and includes a liquid crystal display (LCD), an organic light emitting diode (OLED) display, and the like. Display devices are used in various electronic devices such as a mobile phone, a navigation device, a digital camera, an electronic book, a portable game machine, and various terminals.

An organic light emitting display device includes two electrodes and an organic light emitting layer interposed therebetween, wherein electrons injected from one electrode and holes injected from another electrode are combined in the organic light emitting layer to generate excitons. The generated excitons are changed to a ground state from an excited state, releasing energy to emit light.

Such an organic light emitting display device includes a plurality of pixels including an organic light emitting diode which is a self-emissive element, and in each pixel, a plurality of transistors for driving the organic light emitting diode and at least one capacitor may be formed.

In this case, in order to improve transmittance of the display device, the thickness of the cathode electrode forming part of the organic light emitting diode may be thinly formed.

The above information disclosed in this Background section is only for understanding of the background of the inventive concepts, and, therefore, it may contain information that does not constitute prior art.

SUMMARY

Applicant discovered that as the thickness of the cathode electrode decreases, resistance thereof may increase, and the cathode electrode may be separated in some areas, which may cause a voltage drop phenomenon. Therefore, the display device may have a non-uniform luminance due to the voltage drop of the cathode electrode of the light emitting diode of the display device.

Display devices constructed according to the principles and illustrative embodiments of the invention, and manufacturing methods thereof, are capable of reducing or preventing the voltage drop of the cathode electrode of the light emitting diode thereof such that the display device has substantially uniform luminance.

Additional features of the inventive concepts will be set forth in the description which follows, and in part will be apparent from the description, or may be learned by practice of the inventive concepts.

According to one aspect of the invention, a display device includes: a substrate; a transistor disposed on the substrate; a first electrode connected to the transistor; an emission layer disposed on the first electrode; a second electrode disposed on the emission layer; a common voltage line connected to the second electrode; and a third electrode and a fourth electrode disposed between the common voltage line and the second electrode.

The third electrode may include a first auxiliary electrode in contact with a side surface of the common voltage line, and the fourth electrode may include a second auxiliary electrode disposed on the first auxiliary electrode.

The first auxiliary electrode may include a first inclined surface adjacent to the side surface of the common voltage line; and the second auxiliary electrode may include a second inclined surface adjacent to the first inclined surface of the first auxiliary electrode, and wherein: the first inclined surface of the first auxiliary electrode may be disposed at a first inclination angle, the side surface of the common voltage line may be disposed at a second inclination angle, the first inclination angle being smaller than the second inclination angle, and the second inclined surface of the second auxiliary electrode may be disposed at a third inclination angle smaller than the second inclination angle.

The second electrode may be in contact with the second auxiliary electrode.

The common voltage line may include: a lower layer, an intermediate layer disposed on the lower layer, and an upper layer disposed on the intermediate layer, and the upper layer has a width wider than that of the intermediate layer.

The third electrode may be in contact with a side surface of the intermediate layer, and the fourth electrode may be disposed on the third electrode.

The lower layer may have a width wider than that of the intermediate layer.

The display device may further include: a first layer disposed on the first electrode, the first layer including a pixel opening overlapping the first electrode, and a second layer disposed on the first layer, wherein a second auxiliary electrode and the second layer may be disposed on a same layer.

The first layer may include a bank layer having an upper surface, the second layer may include a separator layer having an edge adjacent to the pixel opening of the bank layer, and the edge of the separator layer may have a lower surface adjacent to the pixel opening and may not in contact with the upper surface of the bank layer.

The lower surface of the edge of the separator layer adjacent to the pixel opening may be in contact with the second electrode.

A portion of the bank layer adjacent to the pixel opening may have a thickness thinner than that of the remaining portion of the bank layer.

The second auxiliary electrode may be connected to the second layer.

A portion of the emission layer overlapping the second layer and a portion of the emission layer not overlapping the second layer may be separated from each other.

A portion of the emission layer overlapping the common voltage line and a portion of the emission layer not overlapping the common voltage line may be separated from each other.

A portion of the second electrode overlapping the second layer and a portion of the second electrode not overlapping the second layer may be connected to each other.

A portion of the second electrode overlapping the common voltage line and a portion of the second electrode not overlapping the common voltage line may be separated from each other.

The emission layer may include: a plurality of light emitting units, and a charge generating layer disposed between the plurality of light emitting units.

The transistor may include: a semiconductor disposed on the substrate, a gate electrode overlapping the semiconductor, and a source electrode and a drain electrode connected to the semiconductor, and wherein the common voltage line, the source electrode, and the drain electrode may be disposed on a same layer.

The third electrode and the first electrode may be formed of a same material.

According to another aspect of the invention, a method of manufacturing a display device includes the steps of: forming a transistor on a substrate; forming a common voltage line spaced apart from the transistor on the substrate; forming a first electrode connected to the transistor; forming a third electrode connected to the common voltage line; forming a fourth electrode on the third electrode; forming an emission layer on the first electrode; and forming a second electrode on the emission layer and the fourth electrode.

The third electrode may be in contact with a side surface of the common voltage line.

The third electrode may include a first auxiliary electrode having a first inclined surface adjacent to a side surface of the common voltage line; and the fourth electrode may include a second auxiliary electrode having a second inclined surface adjacent to the first inclined surface of the first auxiliary electrode, and wherein: the first inclined surface of the first auxiliary electrode may be disposed at a first inclination angle, the side surface of the common voltage line may be disposed at a second inclination angle, the first inclination angle being smaller than the second inclination angle, and the second inclined surface of the second auxiliary electrode may be disposed at a third inclination angle smaller than the first inclination angle.

The second electrode may be in contact with the second auxiliary electrode.

The common voltage line may include: a lower layer, an intermediate layer disposed on the lower layer, and an upper layer disposed on the intermediate layer, and the intermediate layer is made of a different material from that of the upper layer, and the intermediate layer has a width that becomes narrower than that of the upper layer by etching the intermediate layer after forming the common voltage line.

The third electrode may be in contact with a side surface of the intermediate layer.

The intermediate layer may be made of a different material from that of the lower layer, and the intermediate layer may have a width that becomes narrower than that of the lower layer by an etching process of the intermediate layer.

The method may further include the steps of: forming a first layer on the first electrode; forming a pixel opening overlapping the first electrode in the first layer; forming a second layer on the first layer; and performing an ashing process on the first layer to remove a portion of the first layer disposed below the second layer, wherein the fourth electrode and the second layer may be made of a same material and are formed by a same process.

The emission layer may include: a plurality of light emitting units, and a charge generating layer disposed between the plurality of light emitting units.

The transistor may include: a semiconductor disposed on the substrate, a gate electrode overlapping the semiconductor, and a source electrode and a drain electrode connected to the semiconductor, and the common voltage line and the source electrode and the drain electrode are made of a same material and are formed by a same process.

The third electrode and the first electrode may be made of a same material and are formed by a same process.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
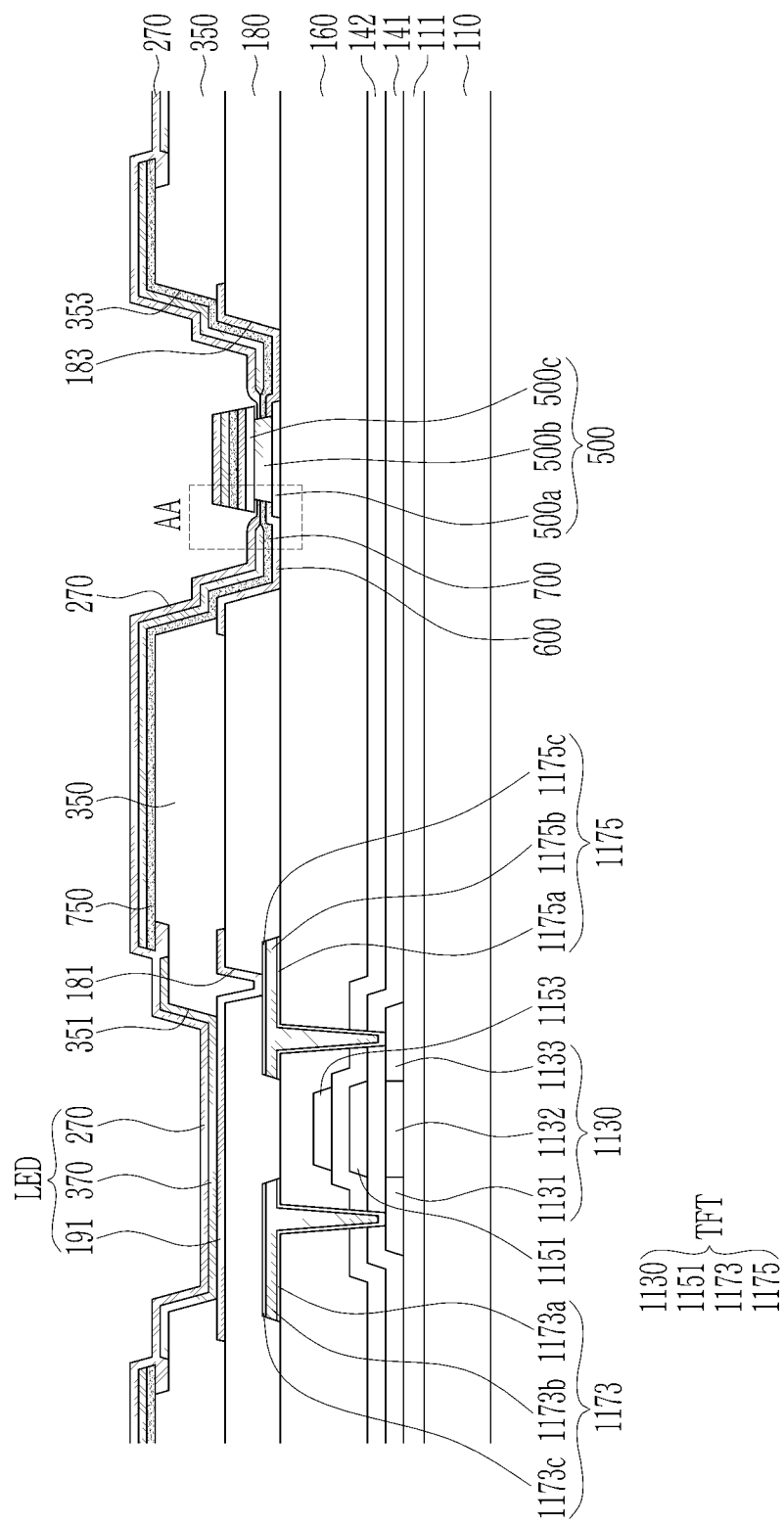
FIG. 1 illustrates a cross-sectional view of an embodiment of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a display device according to an embodiment of the invention will be described with reference to FIGS. 1, 2, and FIG. 3.

Figure 2:
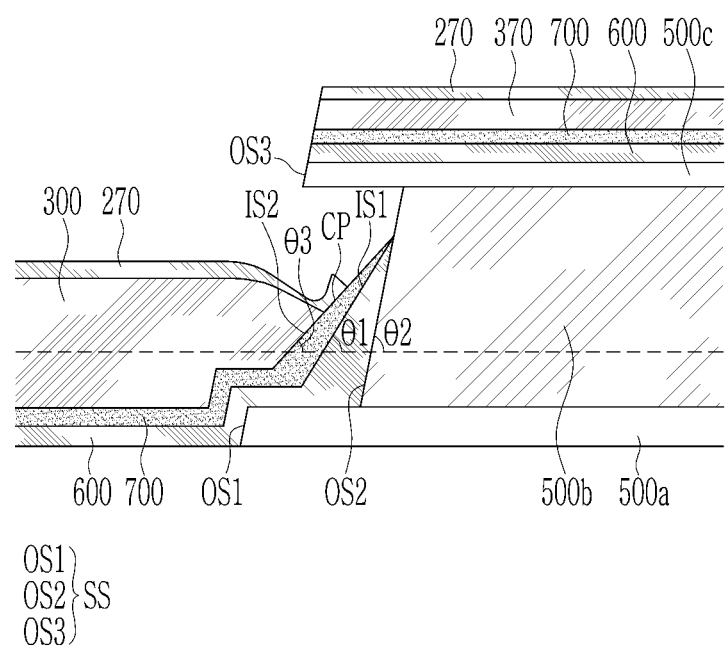
FIG. 2 schematically illustrates an enlarged view of a partial area AA of FIG. 1.
Figure 3:
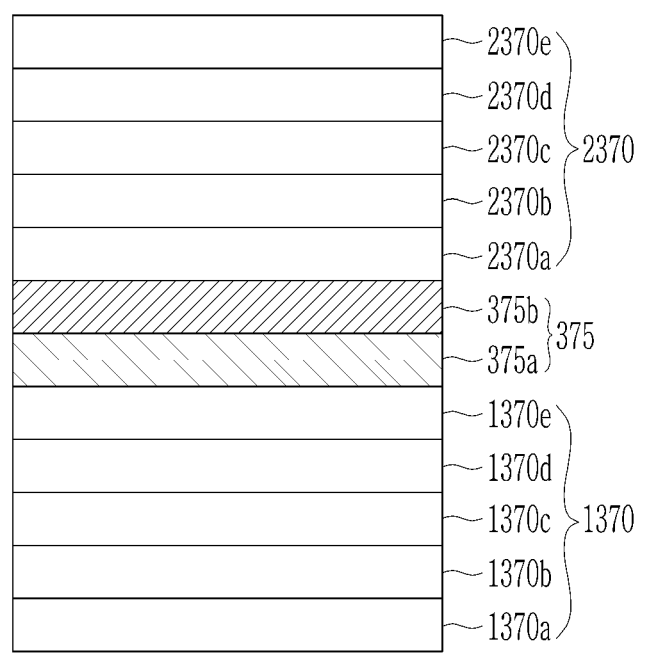
FIG. 3 illustrates a plurality of layers of an emission layer of the display device of FIG. 1.

FIG. 1 illustrates a cross-sectional view of an embodiment of a display device constructed according to the principles of the invention, FIG. 2 illustrates an enlarged view of a partial area AA of FIG. 1, and FIG. 3 illustrates a plurality of layers of an emission layer of the display device of FIG. 1. FIG. 2 illustrates a contact portion of a common voltage line and a second electrode of the display device according to the embodiment, and FIG. 3 illustrates a plurality of layers configuring an emission layer of the display device according to an embodiment.

As shown in FIG. 1, the display device may include a substrate 110, and a semiconductor 1130, a gate electrode 1151, a source electrode 1173, and a drain electrode 1175 disposed on the substrate 110.

The substrate 110 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. The substrate 110 may include a flexible material that may be bent or folded. For example, the substrate 110 may be a single layer or a multilayer.

A buffer layer 111 may be disposed on the substrate 110. The buffer layer 111 may have a single layered structure or a multi-layered structure. The buffer layer 111 may include an inorganic insulating material such as a silicon nitride (SiNx), a silicon oxide (SiOx), and a silicon oxide (SiOxNy), or an organic insulating material. In some embodiments, the buffer layer 210 may be omitted. For example, a barrier layer may be further disposed between the substrate 110 and the buffer layer 111. The barrier layer may have a single-layered structure or a multi-layered structure. The barrier layer may include an inorganic insulating material such as a silicon nitride (SiNx), a silicon oxide (SiOx), and a silicon oxynitride (SiOxNy).

The semiconductor 1130 may be disposed on the buffer layer 111. The semiconductor 1130 may include a first region 1131, a channel 1132, and a second region 1133. The first region 1131 and the second region 1133 may be disposed at respective sides of the channel 1132 of the semiconductor 1130. The semiconductor 1130 may include a semiconductor material such as amorphous silicon, polycrystalline silicon, or an oxide semiconductor.

A first gate insulating film 141 may be disposed on the semiconductor 1130. The first gate insulating film 141 may have a single layered structure or a multi-layered structure. The first gate insulating film 141 may include an inorganic insulating material such as a silicon nitride (SiNx), a silicon oxide (SiOx), and a silicon oxynitride (SiOxNy).

The gate electrode 1151 may be disposed on the first gate insulating film 141. The gate electrode 1151 may overlap the channel 1132 of the semiconductor 1130. The gate electrode 1151 may have a single layered structure or a multi-layered structure. The gate electrode 1151 may include a metallic material such as molybdenum (Mo), aluminum (Al), copper (Cu), and/or titanium (Ti). After forming the gate electrode 1151, a doping process or plasma treatment may be performed on the semiconductor 1130. A portion of the semiconductor 1130, which is covered by the gate electrode 1151, may not be doped or plasma-treated, and a portion of the semiconductor 1130, which is not covered by the gate electrode 1151, may be doped or plasma-treated to be able to have the same characteristic as a semiconductor.

A second gate insulating film 142 may be disposed on the gate electrode 1151. The second gate insulating film 142 may have a single layered structure or a multi-layered structure. The second gate insulating film 142 may include an inorganic insulating material such as a silicon nitride (SiNx), a silicon oxide (SiOx), and a silicon oxynitride (SiOxNy).

A first storage electrode 1153 may be disposed on the second gate insulating film 142. The first storage electrode 1153 may have a single layered structure or a multi-layered structure. The first storage electrode 1153 may include a metallic material such as molybdenum (Mo), aluminum (Al), copper (Cu), and/or titanium (Ti). The first storage electrode 1153 may overlap the gate electrode 1151 to form a storage capacitor.

An interlayer insulating film 160 may be disposed on the first storage electrode 1153. The interlayer insulating film 160 may have a single layered structure or a multi-layered structure. The interlayer insulating film 160 may include an inorganic insulating material or an organic insulating material.

The source electrode 1173 and the drain electrode 1175 may be disposed on the interlayer insulating film 160. The source electrode 1173 and the drain electrode 1175 may have a single-layered structure or a multi-layered structure. The source electrode 1173 and the drain electrode 1175 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu).

The source electrode 1173 and the drain electrode 1175 may include lower layers 1173a and 1175a, intermediate layers 1173b and 1175b, and upper layers 1173c and 1175c. The lower layers 1173a and 1175a may be directly disposed on the interlayer insulating film 160. The intermediate layers 1173b and 1175b may be disposed on the lower layers 1173a and 1175a. The upper layers 1173c and 1175c may be disposed on the intermediate layers 1173b and 1175b. The intermediate layers 1173b and 1175b may be made of a different material from that of the lower layers 1173a and 1175a and the upper layers 1173c and 1175c. For example, the intermediate layers 1173b and 1175b may be made of aluminum (Al), and the lower layers 1173a and 1175a and the upper layers 1173c and 1175c may be made of titanium (Ti). However, this is only an example, and materials of the lower layers 1173a and 1175a, the intermediate layers 1173b and 1175b, and the upper layers 1173c and 1175c may be variously changed. In addition, the source electrode 1173 and the drain electrode 1175 may be formed in a double layer, or may be formed to have a form in which four or more layers are deposited.

The interlayer insulating film 160 may include an opening overlapping the source electrode 1173 and the first region 1131 of the semiconductor 1130. The source electrode 1173 may be connected to the first region 1131 of the semiconductor 1130 through the opening. The interlayer insulating film 160 may include an opening overlapping the drain electrode 1175 and the second region 1133 of the semiconductor 1130. The drain electrode 1175 may be connected to the second region 1133 of the semiconductor 1130 through the opening.

The semiconductor 1130, the gate electrode 1151, the source electrode 1173, and the drain electrode 1175 configure one transistor TFT. In some embodiments, the transistor TFT may include only the source and drain regions of the semiconductor 1130 instead of the source electrode 1173 and drain electrode 1175.

A common voltage line 500 may be disposed on the interlayer insulating film 160. The common voltage line 500 may have a single layered structure or a multi-layered structure. The common voltage line 500 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu). The common voltage line 500 may be disposed on the same layer as the source electrode 1173 and the drain electrode 1175. The common voltage line 500 may be made of the same material as the source electrode 1173 and the drain electrode 1175, and may be formed by the same process as that which forms the source electrode 1173 and the drain electrode 1175.

The common voltage line 500 may include a lower layer 500a, an intermediate layer 500b, and an upper layer 500c. The lower layer 500a may be directly disposed on the interlayer insulating film 160. The intermediate layer 500b may be disposed on the lower layer 500a. The upper layer 500c may be disposed on the intermediate layer 500b. The intermediate layer 500b may be made of a different material from that of the lower layer 500a and the upper layer 500c.

For example, the intermediate layer 500b may be made of aluminum (Al), and the lower layer 500a and the upper layer 500c may be made of titanium (Ti). However, this is only an example, and the materials of the lower layer 500a, the intermediate layer 500b, and the upper layer 500c may be variously changed. In addition, the common voltage line 500 may be formed in a double layer, or may be formed in a form in which four or more layers are deposited.

As shown in FIG. 2, the width of the upper layer 500c of the common voltage line 500 may be wider than that of the intermediate layer 500b. Accordingly, an outer side surface of the upper layer 500c may have a shape that is not aligned with an outer side surface of the intermediate layer 500b and protrudes more than the side surface of the intermediate layer 500b. A lower surface of the upper layer 500c may be in contact with an upper surface of the intermediate layer 500b. However, at least a portion of the lower surface of the upper layer 500c may not be in contact with the upper surface of the intermediate layer 500b. An edge portion of the lower surface of the upper layer 500c may not contact the upper surface of the intermediate layer 500b.

The width of the lower layer 500a of the common voltage line 500 may be substantially the same as that of the upper layer 500c of the common voltage line 500. The width of the lower layer 500a of the common voltage line 500 may be wider than that of the intermediate layer 500b of the common voltage line 500. Accordingly, an outer side surface OS1 of the lower layer 500a may have a shape that is not aligned with an outer side surface OS2 of the intermediate layer 500b and protrudes more than the side surface OS2 of the intermediate layer 500b. An upper surface of the lower layer 500a may be in contact with a lower surface of the intermediate layer 500b. However, at least a portion of the upper surface of the lower layer 500a may not be in contact with the lower surface of the intermediate layer 500b. An edge portion of the upper surface of the lower layer 500a may not contact the lower surface of the intermediate layer 500b.

A passivation film 180 may be disposed on the source electrode 1173 and the drain electrode 1175. The passivation film 180 may include an organic insulating material such as a general purpose polymer such as polymethyl methacrylate (PMMA) or polystyrene (PS), a polymer derivative having a phenolic group, an acryl-based polymer, an imide-based polymer, a polyimide, an acryl-based polymer, and a siloxane-based polymer.

A first electrode 191 may be disposed on the passivation film 180. The first electrode 191 is also referred to as anode electrode, and may be formed in a single layer or a multi-layer that includes a transparent conductive oxide film or a metal material. The transparent conductive oxide film may include an indium tin oxide (ITO), a poly-ITO, an indium zinc oxide (IZO), an indium gallium zinc oxide (IGZO), and an indium tin zinc oxide (ITZO). The metal material may include silver (Ag), molybdenum (Mo), copper (Cu), gold (Au), and aluminum (Al). For example, the first electrode 191 may have a structure in which a layer made of ITO, a layer made of silver (Ag), and a layer made of ITO are sequentially stacked.

The passivation film 180 may include an opening 181 overlapping the drain electrode 1175 and the first electrode 191. The first electrode 191 may be connected to the drain electrode 1175 through the opening 181. The first electrode 191 may be in contact with an upper surface of the upper layer 1175c of the drain electrode 1175. Accordingly, the first electrode 191 may receive an output current to be transmitted from the drain electrode 1175 to an emission layer 370.

The passivation film 180 may include an opening 183 overlapping the common voltage line 500. The common voltage line 500 may not be covered by the passivation film 180. For example, an upper surface and a side surface SS of the common voltage line 500 may be entirely exposed by the opening 183. Further, an upper surface of the interlayer insulating film 160 disposed around the common voltage line 500 may also be exposed by the opening 183.

A third electrode, which may be in the form of a first auxiliary electrode 600, may be disposed within the opening 183 of the passivation film 180. The first auxiliary electrode 600 may also be disposed on the passivation film 180. The first auxiliary electrode 600 may be disposed on the same layer as the first electrode 191. The first auxiliary electrode 600 may be made of the same material as the first electrode 191, and may be formed in the same process.

The first auxiliary electrode 600 may be disposed on the common voltage line 500, and may be in contact with a side surface SS of the common voltage line 500. The first auxiliary electrode 600 may be disposed on the lower layer 500a of the common voltage line 500, and may be in contact with a side surface OS2 of the intermediate layer 500b. Further, the first auxiliary electrode 600 may be disposed on the upper layer 500c of the common voltage line 500. A portion of the first auxiliary electrode 600, which is in contact with the lower layer 500a and the intermediate layer 500b of the common voltage line 500, may be separated or disconnected from a portion of the first auxiliary electrode 600 disposed on the upper layer 500c of the common voltage line 500.

A first layer, which may be in the form of a bank layer 350, may be disposed on the first electrode 191, the first auxiliary electrode 600, and the passivation film 180. The bank layer 350 may be also referred to as a pixel defining layer (PDL), and may include a pixel opening 351 overlapping the first electrode 191. In this case, the pixel opening 351 may overlap a central portion of the first electrode 191, and may not overlap an edge portion of the first electrode 191. Accordingly, the size of the pixel opening 351 may be smaller than that of the first electrode 191. The bank layer 350 may be an organic insulating film including one or more of a polyimide, a polyamide, an acryl resin, benzocyclobutene, and a phenol resin. In some embodiments, the bank layer 350 may be formed as a black pixel defining layer (BPDL) including a black color pigment.

The bank layer 350 may include an opening 353 overlapping the common voltage line 500. The opening 353 of the bank layer 350 may also overlap the opening 183 of the passivation film 180. The opening 353 of the bank layer 350 may have a wider width than the opening 183 of the passivation film 180. The size of the opening 353 of the bank layer 350 may be larger than that of the common voltage line 500.

A second layer, which may be in the form of a separator layer 750, may be disposed on the bank layer 350. An edge of the separator layer 750 may be adjacent to the pixel opening 351 of the bank layer 350. The thickness of a portion of the bank layer 350 adjacent to the edge of the separator layer 750 may be thinner than those of other portions thereof. For example, the thickness of a portion of the bank layer 350 adjacent to the pixel opening 351 may be thinner than that of the remaining portion of the bank layer 350. A lower surface of the separator layer 750 may be in contact with an upper surface of the bank layer 350. However, an edge portion of the lower surface of the separator layer 750 may not contact an upper surface of the bank layer 350. The separator layer 750 may be formed of a transparent conductive oxide film such as an indium tin oxide (ITO), a poly-ITO, an indium zinc oxide (IZO), an indium gallium zinc oxide (IGZO), and an indium tin zinc oxide (ITZO).

A fourth electrode, which may be in the form of the second auxiliary electrode 700, may be disposed on the first auxiliary electrode 600. The second auxiliary electrode 700 may be disposed on the same layer as the separator layer 750. The second auxiliary electrode 700 may be made of the same material as the separator layer 750, and may be formed in the same process as that which forms the separator layer 750. The second auxiliary electrode 700 may or may not be connected to the separator layer 750.

The second auxiliary electrode 700 may be in contact with the upper surface of the first auxiliary electrode 600, and may be in contact with the side surface SS of the common voltage line 500. The second auxiliary electrode 700 may be in contact with the side surface OS2 of the intermediate layer 500b of the common voltage line 500. The second auxiliary electrode 700 may also be disposed on the upper layer 500c of the common voltage line 500. A portion of the second auxiliary electrode 700, which is in contact with the side surface OS2 of the intermediate layer 500b of the common voltage line 500, may be separated or disconnected from a portion of the second auxiliary electrode 700 disposed on the upper layer 500c of the common voltage line 500.

The emission layer 370 may be disposed on the first electrode 191. As shown in FIG. 3, the emission layer 370 may include a charge generating layer 375 disposed between a plurality of light emitting units 1370 and 2370 and the plurality of light emitting units 1370 and 2370.

The plurality of light emitting units 1370 and 2370 may include a first light emitting unit 1370 and a second light emitting unit 2370. Each of the first light emitting unit 1370 and the second light emitting unit 2370 may include a plurality of layers. The first light emitting unit 1370 and the second light emitting unit 2370 may include electron injection layers 1370a and 2370a, electron transporting layers 1370b and 2370b, organic emission layers 1370c and 2370c, hole transporting layers 1370d and 2370d, and hole injection layer 1370e and 2370e, respectively. The organic emission layers 1370c and 2370c may include a low molecular weight organic material or high molecular weight organic material that emits light such as red light, green light, and blue light. In another embodiment, at least some of the electron injection layers 1370a and 2370a, the electron transporting layers 1370b and 2370b, the hole transporting layers 1370d and 2370d, and the hole injection layers 1370e and 2370e may be omitted. The electron injection layer 1370a of the first light emitting unit 1370 may be in contact with the first electrode 191. The hole injection layer 2370e of the second light emitting unit 2370 may be in contact with the second electrode 270.

The charge generating layer 375 may be disposed between the first light emitting unit 1370 and the second light emitting unit 2370. The charge generating layer 375 may be a layer that generates electrons to function as a cathode for one of two light emitting units 1370 and 2370 adjacent to each other, and generates holes to function as an anode for the other thereof. For example, the charge generating layer 375 may function as a cathode for the first light emitting unit 1370, and may function as an anode for the second light emitting unit 2370.

The charge generating layer 375 may include an n-type charge generating layer 375a and a p-type charge generating layer 375b. The n-type charge generating layer 375a and the p-type charge generating layer 375b may contact each other to form an NP junction. Electrons and holes may be simultaneously generated between the n-type charge generating layer 375a and the p-type charge generating layer 375b by the NP junction. The generated electrons may be transferred to one of two light emitting units 1370 and 2370 adjacent to each other through the n-type charge generating layer 375a. The generated holes may be transferred to the other of the two light emitting units 1370 and 2370 adjacent to each other through the p-type charge generating layer 375b.

While the emission layer 370 described above includes two light emitting units, embodiments of the invention are not limited thereto. In another embodiment, the emission layer 370 may include three or more light emitting units. For example, the emission layer 370 may include three light emitting units and two charge generating layers disposed between them.

The emission layer 370 may be disposed not only on the first electrode 191, but also on other areas on the substrate 110. The organic emission layers 1370c and 2370c of the emission layer 370 may be patterned to be disposed only within the pixel opening 351. Except for the organic emission layers 1370c and 2370c, the remaining layers may be entirely disposed on the substrate 110. The electron injection layers 1370a and 2370a, the electron transporting layers 1370b and 2370b, the hole transporting layers 1370d and 2370d, the hole injection layers 1370e and 2370e, and the charge generating layer 375 may be entirely disposed on the substrate 110.

A portion of the emission layer 370 disposed on the first electrode 191 may be separated or disconnected from other portions of the emission layer 370 disposed on the remaining portions other than the first electrode. The emission layer 370 may be separated from an edge portion of the pixel opening 351 by the separator layer 750. For example, the emission layers 370 disposed at respective sides of the edge portion of the separator layer 750 may be separated from each other. A portion of the emission layer 370 overlapping the separator layer 750 and a portion of the emission layer 370 not overlapping the separator layer 750 may be separated from each other. A portion of the emission layer 370 disposed on the separator layer 750 and a portion of the emission layer 370 disposed within the pixel opening 351 may be separated from each other. The emission layer 370 may be formed as a plurality of layers, some layers of the emission layer 370 may be divided in the edge portion of the pixel opening 351, and some other layers may be connected to each other. For example, the first light emitting unit 1370 and the charge generating layer 375 may be separated in the edge portion of the pixel opening 351, and the second light emitting unit 2370 may be connected to the edge portion of the pixel opening 351.

The emission layer 370 may also be disposed on the second auxiliary electrode 700. Further, the emission layer 370 may be disposed on the upper layer 500c of the common voltage line 500, and may overlap the common voltage line 500. A portion of the emission layer 370 overlapping the common voltage line 500 may be separated from a portion of the emission layer 370 not overlapping the common voltage line 500. A portion of the emission layer 370 disposed on the upper surface of the upper layer 500c of the common voltage line 500 may be separated from a portion of the emission layer 370 adjacent to the side surface SS of the common voltage line 500. For example, the emission layer 370 may be separated from the edge portion of the common voltage line 500. The emission layer 370 may be formed as a plurality of layers, and all layers of the emission layer 370 may be divided in the edge portion of the common voltage line 500. The side surface SS of the common voltage line 500 may not be covered by the emission layer 370. In addition, at least a portion of the edge of the second auxiliary electrode 700 may not be covered by the emission layer 370. A portion of the second auxiliary electrode 700 adjacent to the side surface SS of the common voltage line 500 may not be covered by the emission layer 370.

The second electrode 270 may be disposed on the emission layer 370. The second electrode 270 is also referred to as a cathode, and may be formed of a transparent conductive layer including an indium tin oxide (ITO), an indium zinc oxide (IZO), an indium gallium zinc oxide (IGZO), and an indium tin zinc oxide (ITZO). In addition, the second electrode 270 may have a translucent characteristic, and may form a micro-cavity together with the first electrode 191. The first electrode 191, the emission layer 370, and the second electrode 270 may form a light emitting diode (LED).

The second electrode 270 may contact the emission layer 370. The emission layer 370 may be divided around the edge of the pixel opening 351 by the separator layer 750. The second electrodes 270 disposed on a portion, in which the emission layer 370 is divided, are not separated from each other, but may be connected to each other. For example, the second electrodes 270 may be connected to each other around the edge of the pixel opening 351. An overlapping portion of the second electrode 270 overlapping the separator layer 750 and a non-overlapping portion of the second electrode 270 not overlapping the separator layer 750 may be connected to each other. However, a step may be formed by the divided emission layers 370, and thus the overlapping portion and the non-overlapping portion of the second electrode 270 may not be smoothly connected to each other. The second electrode 270 may be in contact with a partial area of the separator layer 750. A lower surface of the edge of the separator layer 750 adjacent to the pixel opening 351 may be in contact with the second electrode 270 without contacting the upper surface of the bank layer 350. For example, the second electrode 270 may be disposed between the edge of the separator layer 750 adjacent to the pixel opening 351 and the bank layer 350.

The second electrode 270 may be entirely disposed on the substrate 110. The second electrode 270 may be connected to the common voltage line 500. A common voltage ELVSS may be applied to the second electrode 270 and the common voltage line 500. Thus, the common voltage line 500 may prevent or minimize a voltage drop of the common voltage ELVSS in the second electrode 270 when the second electrode 270 is not smoothly connected in some areas.

The second electrode 270 may be in contact with the side surface SS of the common voltage line 500. The second electrode 270 may be in direct contact with the side surface SS of the common voltage line 500. Alternatively, the second electrode 270 may not be in direct contact with the side surface SS of the common voltage line 500. The first auxiliary electrode 600 and the second auxiliary electrode 700 may be disposed between the second electrode 270 and the common voltage line 500. The first auxiliary electrode 600 may be in contact with the side surface SS of the intermediate layer 500$b$ of the common voltage line 500, and the second auxiliary electrode 700 may be disposed on the first auxiliary electrode 600. The second electrode 270 may be in contact with the second auxiliary electrode 700. In a portion in which the first auxiliary electrode 600 and the side surface SS of the common voltage line 500 contact each other, a first side surface IS1 of the first auxiliary electrode 600 is disposed at a first inclination angle θ1. A side surface SS (OS1, OS2, and OS3) of the common voltage line 500 is dispose a second inclination angle θ2, and a second side surface IS2 of the second auxiliary electrode may be disposed at a third inclination angle θ3. The first inclination angle θ1 may be smaller than the second inclination angle θ2 of the side surface OS2 of the common voltage line 500, and the third inclination angle θ3 of the second surface IS2 of the second auxiliary electrode 700 may be smaller than the first inclination angle θ1 of the first surface IS1 of the first auxiliary electrode 600 (see FIG. 2).

A portion of the second electrode 270 overlapping the common voltage line 500 may be separated or disconnected from a portion of the second electrode 270 not overlapping the common voltage line 500. A portion of the second electrode 270 disposed on the upper surface of the upper layer 500$c$ of the common voltage line 500 may be separated from a portion of the second electrode 270 adjacent to the side surface SS of the common voltage line 500.

Figure 4:
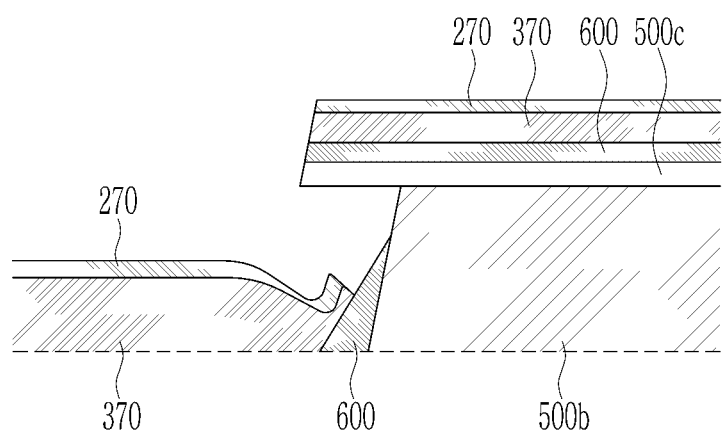
FIG. 4 illustrates a cross-sectional view of a display device according to a reference example.

Referring to FIG. 4, a display device according to a reference example and the display device according to FIG. 2 will be compared and described. FIG. 4 illustrates a cross-sectional view of a display device according to a reference example in which the second auxiliary electrode is omitted from the display device.

In the display device according to the reference example, the first auxiliary electrode 600 may be in contact with the side surface SS of the common voltage line 500, and the emission layer 370 may be disposed on the first auxiliary electrode 600. The second electrode 270 may be disposed on the emission layer 370, and the second electrode 270 may not be connected to the first auxiliary electrode 600. The second electrode 270 and the first auxiliary electrode 600 may not be connected to each other by the emission layer 370 disposed between the second electrode 270 and the first auxiliary electrode 600. Accordingly, the second electrode 270 and the common voltage line 500 may not be connected, and a voltage drop may occur in the second electrode 270.

In the display device according to the embodiment of FIG. 2, since the second auxiliary electrode 700 may be disposed on the first auxiliary electrode 600, the inclination angle of a connection portion CP between the second electrode 270 and the common voltage line 500 may be further reduced. Accordingly, the second electrode 270 may be smoothly connected to the common voltage line 500, thereby minimizing or preventing the voltage drop of the second electrode 270 from occurring. Therefore, it is possible to implement a display device with uniform luminance as a whole.

The first auxiliary electrode 600 and the first electrode 191 may be disposed on the same layer, and the second auxiliary electrode 700 and the separator layer 750 may be disposed on the same layer. For example, the first auxiliary electrode 600 and the first electrode 191 may be formed of the same material in the same process, and the second auxiliary electrode 700 and the separator layer 750 may be formed of the same material in the same process. Therefore, it is possible to form the first auxiliary electrode 600 and the second auxiliary electrode 700 without an additional process, thereby reducing a process cost.

An encapsulation layer may be further disposed on the second electrode 270. The encapsulation layer may protect the light emitting diode (LED) from moisture or oxygen that may permeate from the outside, and may include at least one inorganic film and at least one organic film. For example, the encapsulation layer may have a structure in which a first inorganic encapsulation layer, an organic encapsulation layer, and a second inorganic encapsulation layer may be stacked. However, this is only an example, and the number of inorganic and organic films configuring the encapsulation layer may be variously changed.

Although the structure in which one transistor is connected to the light emitting diode (LED) has been described above, each light emitting diode (LED) may be connected to a plurality of transistors. Hereinafter, referring to FIG. 5, an example of one representative pixel of the display device will be described.

Figure 5:
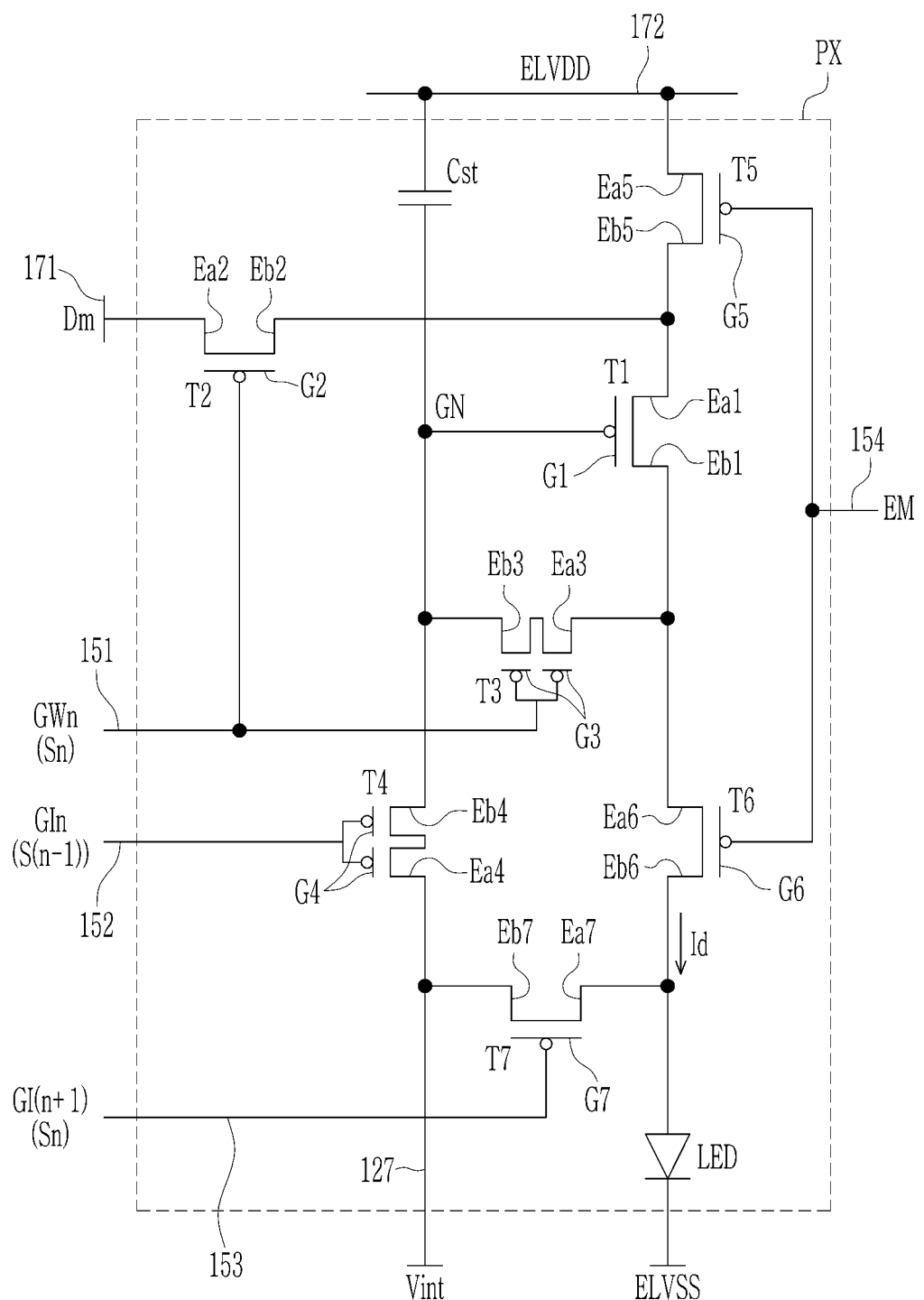
FIG. 5 illustrates a circuit diagram of a representative pixel of the display device of FIG. 1.

FIG. 5 illustrates a circuit diagram of a representative pixel of the display device of FIG. 1.

As shown in FIG. 5, the display device may include a plurality of pixels PX for displaying an image and a plurality of signal lines 127, 151, 152, 153, 154, 171, and 172. The pixel PX may include a plurality of transistors T1, T2, T3, T4, T5, T6, and T7 connected to the plurality of signal lines 127, 151, 152, 153, 154, 171, and 172, a capacitor Cst, and at least one light emitting diode LED. In the following descriptions, an example in which the pixel PX includes one light emitting diode LED will be mainly described.

The signal lines 127, 151, 152, 153, 154, 171, and 172 may include an initialization voltage line 127, a plurality of scan lines 151, 152, and 153, an emission control line 154, a data line 171, and a driving voltage line 172.

The initialization voltage line 127 may transmit an initialization voltage Vint. The plurality of scan lines 151, 152, and 153 may respectively transmit scan signals GWn, GIn, and GI(n+1). The scan signals GWn, GIn, and GI(n+1) may transmit a gate-on voltage that may turn-on the transistors T2, T3, T4, and T7 and a gate-off voltage that may turn-off the transistors T2, T3, T4, and T7 included in the pixel PX.

The scan lines 151, 152, and 153 connected to the pixel PX may include a first scan line 151 capable of transmitting the scan signal GWn, a second scan line 152 capable of transmitting the scan signal GIn having a gate-on voltage at different timing from that of the first scan line 151, and a third scan line 153 capable of transmitting a scan signal GI(n+1). In the illustrated embodiment, an example in which the second scan line 152 transmits a gate-on voltage at earlier timing than the first scan line 151 will be mainly described. For example, when the scan signal GWn is an n-th scan signal Sn (wherein n is a natural number of 1 or more) among scan signals applied during one frame, the scan signal GIn may be a previous scan signal such as an (n−1)-th scan signal, and the scan signal GI(n+1) may be an n-th scan signal Sn. However, embodiments are not limited thereto, and the scan signal GI(n+1) may be a scan signal different from the n-th scan signal Sn.

The emission control line 154 may transmit a control signal, and particularly, may transmit an emission control signal EM capable of controlling light emission of the light emitting diode LED included in the pixel PX. The control signal transmitted by the emission control line 154 may transmit a gate-on voltage and a gate-off voltage, and may have a different waveform from that of a scan signal transmitted by the scan lines 151, 152, and 153.

The data line 171 may transmit a data signal Dm, and the driving voltage line 172 may transmit a driving voltage ELVDD. The data signal Dm may have a different voltage level according to an image signal inputted to the display device, and the driving voltage ELVDD may have a substantially constant voltage level.

The display device may further include a driver that transmits a signal to the plurality of signal lines 127, 151, 152, 153, 154, 171, and 172.

The plurality of transistors T1, T2, T3, T4, T5, T6, and T7 included in the pixel PX may include a first transistor T1, a second transistor T2, a third transistor T3, a fourth transistor T4, a fifth transistor T5, a sixth transistor T6, and a seventh transistor T7.

The first scan line 151 may transmit the scan signal GWn to the second transistor T2 and the third transistor T3, the second scan line 152 may transmit the scan signal Gin to the fourth transistor T4, the third scan line 153 may transmit the scan signal GI(n+1) to the seventh transistor T7, and the emission control line 154 may transmit the emission control signal EM to the fifth transistor T5 and the sixth transistor T6.

A gate electrode G1 of the first transistor T1 may be connected to one end of the capacitor Cst through a driving gate node (GN), a first electrode Ea1 of the first transistor T1 may be connected to the driving voltage line 172 via the fifth transistor T5, and a second electrode Eb1 of the first transistor T1 may be connected to anode of the light emitting diode LED via the sixth transistor T6. The first transistor T1 may receive the data signal Dm transmitted by the data line 171 according to a switching operation of the second transistor T2 to supply a driving current Id to the light emitting diode LED.

A gate electrode G2 of the second transistor T2 may be connected to the first scan line 151, a first electrode Ea2 of the second transistor T2 may be connected to the data line 171, and a second electrode Eb2 of the second transistor T2 may be connected to the first electrode Ea1 of the first transistor T1 and may be connected to the driving voltage line 172 via the fifth transistor T5. The second transistor T2 may be turned on according to the scan signal GWn transmitted through the first scan line 151 to transmit the data signal Dm transmitted from the data line 171 to the first electrode Ea1 of the first transistor T1.

A gate electrode G3 of the third transistor T3 may be connected to the first scan line 151, and a first electrode Ea3 of the third transistor T3 may be connected to the second electrode Eb1 of the first transistor T1 and may be connected to the anode of the light emitting diode LED via the sixth transistor T6. A second electrode Eb3 of the third transistor T3 may be connected to a second electrode Eb4 of the fourth transistor T4, one end of capacitor Cst, and the gate electrode G1 of the first transistor T1. The third transistor T3 may be turned on in response to the scan signal GWn transmitted through the first scan line 151 to connect the gate electrode G1 and the second electrode Eb1 of the first transistor T1 to each other to diode-connect the first transistor T1.

A gate electrode G4 of the fourth transistor T4 may be connected to the second scan line 152, a first electrode Ea4 of the fourth transistor T4 may be connected to a terminal of the initialization voltage Vint, and a second electrode Eb4 of the fourth transistor T4 may be connected to one end of the capacitor Cst and the gate electrode G1 of the first transistor T1 through the second electrode Eb3 of the third transistor T3. The fourth transistor T4 may be turned on according to the scan signal GIn received through the second scan line 152 to transmit the initialization voltage Vint to the gate electrode G1 of the first transistor T1 to perform an initializing operation for initializing a voltage of the gate electrode G1 of the first transistor T1.

A gate electrode G5 of the fifth transistor T5 may be connected to the emission control line 154, a first electrode Ea5 of the fifth transistor T5 may be connected to the driving voltage line 172, and a second electrode Eb5 of the fifth transistor T5 may be connected to the first electrode Ea1 of the first transistor T1 and the second electrode Eb2 of the second transistor T2.

A gate electrode G6 of the sixth transistor T6 may be connected to the emission control line 154, a first electrode Ea6 of the sixth transistor T6 may be connected to the second electrode Eb1 of the first transistor T1 and the first electrode Ea3 of the third transistor T3, and a second electrode Eb6 of the sixth transistor T6 may be electrically connected to the anode of the light emitting diode LED. The fifth transistor T5 and the sixth transistor T6 may be simultaneously turned on in response to the light emission control signal EM received through the emission control line 154, and through this, the driving voltage ELVDD may be compensated through the diode-connected first transistor T1 to be transmitted to the light emitting diode LED.

A gate electrode G7 of the seventh transistor T7 may be connected to the third scan line 153, a first electrode Ea7 of the seventh transistor T7 may be connected to the second electrode Eb6 of the sixth transistor T6 and the anode of the light emitting diode LED, and a second electrode Eb7 of the seventh transistor T7 may be connected to the terminal of the initialization voltage Vint and the first electrode Ea4 of the fourth transistor T4.

The transistors T1, T2, T3, T4, T5, T6, and T7 may be P-type channel transistors such as a PMOS, but embodiments are not limited thereto, and at least one of the transistors T1, T2, T3, T4, T5, T6, and T7 may be an N-type channel transistor.

As described above, one end of capacitor Cst may be connected to the gate electrode G1 of the first transistor T1, and the other end thereof may be connected to the driving voltage line 172. The cathode of the light emitting diode LED may be connected to a common voltage ELVSS terminal that transmits a common voltage ELVSS to receive the common voltage ELVSS.

While the pixel PX is described above as including seven transistors T1, T2, T3, T4, T5, T6, and T7, one storage capacitor Cst, and one light emitting diode LED, this is only an example, and the number of transistors, the number of capacitors, the number of light emitting diodes LED, and their connection relationship may be variously changed.

Hereinafter, a method of manufacturing a display device according to an embodiment will be described with reference to FIG. 6 to FIG. 18.

FIGS. 6, 7, 8, 9, 10, 11, 12, 13, 14, 15, 16, 17, and FIG. 18 illustrate sequential process cross-sectional views of a manufacturing method of the display device of FIG. 1.

Figure 6:
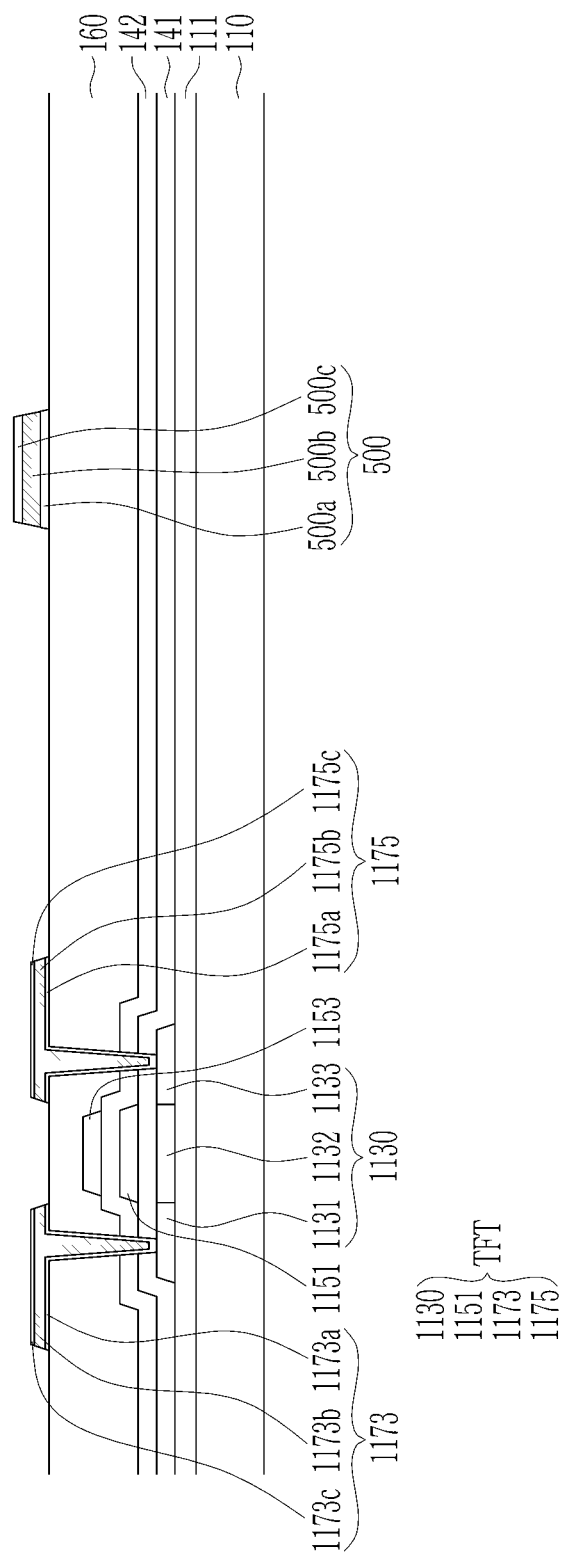
FIGS. 6, 7, 8, 9, 10, 11, 12, 13, 14, 15, 16, 17, and 18 illustrate illustrative sequential process cross-sectional views of a manufacturing method of the display device of FIG. 1.

As shown in FIG. 6, the buffer layer 111 may be formed on the substrate 110 by using an inorganic insulating material or an organic insulating material. The semiconductor 1130 may be formed on the buffer layer 111 by using a semiconductor material. The semiconductor material may be made of amorphous silicon, polysilicon, an oxide semiconductor, or the like. The first gate insulating film 141 may be formed on the semiconductor 1130 and the buffer layer 111 by using an inorganic insulating material.

The gate electrode 1151 may be formed by depositing a metal material on the first gate insulating film 141 and patterning the deposited metal material. The gate electrode 1151 may overlap the semiconductor 1130. After forming the gate electrode 1151, the portion of the semiconductor 1130, which does not overlap the gate electrode 1151, may be treated to have semiconductor properties by a doping process or plasma treatment. Accordingly, the portion of the semiconductor 1130 overlapping the gate electrode 1151 becomes the channel 1132, and the portion of the semiconductor 1130 that does not overlap the gate electrode 1151 becomes the first region 1131 and the second region 1133. The second gate insulating film 142 may be formed by using an inorganic insulating material on the gate electrode 1151 and the first gate insulating film 141.

The first storage electrode 1153 may be formed by depositing a metal material on the second gate insulating film 142 and patterning the deposited metal material. The first storage electrode 1153 may overlap the gate electrode 1151. The interlayer insulating film 160 may be formed by using an inorganic insulating material or an organic insulating material on the first storage electrode 1153 and the second gate insulating film 142. The interlayer insulating film 160 may be patterned to form an opening exposing at least a portion of the first region 1131 and the second region 1133 of the semiconductor 1130.

A metal material may be continuously deposited on the interlayer insulating film 160 and patterned to form the source electrode 1173 and the drain electrode 1175. The source electrode 1173 may be connected to the first region 1131 of the semiconductor 1130 through the opening, and the drain electrode 1175 may be connected to the second region 1133 of the semiconductor 1130 through the opening. The metal material may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu). For example, a triple layer may be formed by sequentially stacking titanium (Ti), aluminum (Al), and titanium (Ti). The source electrode 1173 and the drain electrode 1175 may include the lower layers 1173a and 1175a, the intermediate layers 1173b and 1175b, and the upper layers 1173c and 1175c.

The common voltage line 500 may be formed on the interlayer insulating film 160. The common voltage line 500, the source electrode 1173, and the drain electrode 1175 may be made of the same material and in the same process. For example, the source electrode 1173, the drain electrode 1175, and the common voltage line 500 may be formed together by continuously depositing and patterning a metal material. Accordingly, the common voltage line 500, the source electrode 1173, and the drain electrode 1175 may be disposed on the same layer (e.g., the interlayer insulating film 160). The common voltage line 500 may include the lower layer 500a, the intermediate layer 500b, and the upper layer 500c. The lower layer 500a of the common voltage line 500, the lower layer 1173a of the source electrode 1173, and the lower layer 1175a of the drain electrode 1175 may be made of the same material, and may be disposed on the same layer (e.g., the interlayer insulating film 160). The intermediate layer 500b of the common voltage line 500, the intermediate layer 1173b of the source electrode 1173, and the intermediate layer 1175b of the drain electrode 1175 may be made of the same material, and may be disposed on the same material layers (e.g., the lower layers 1173a, 1175a, and 500a). The upper layer 500c of the common voltage line 500, the upper layer 1173c of the source electrode 1173, and the upper layer 1175c of the drain electrode 1175 may be made of the same material, and may be disposed on the same material layers (the intermediate layers 1173b, 1175b, and 500b).

Figure 7:
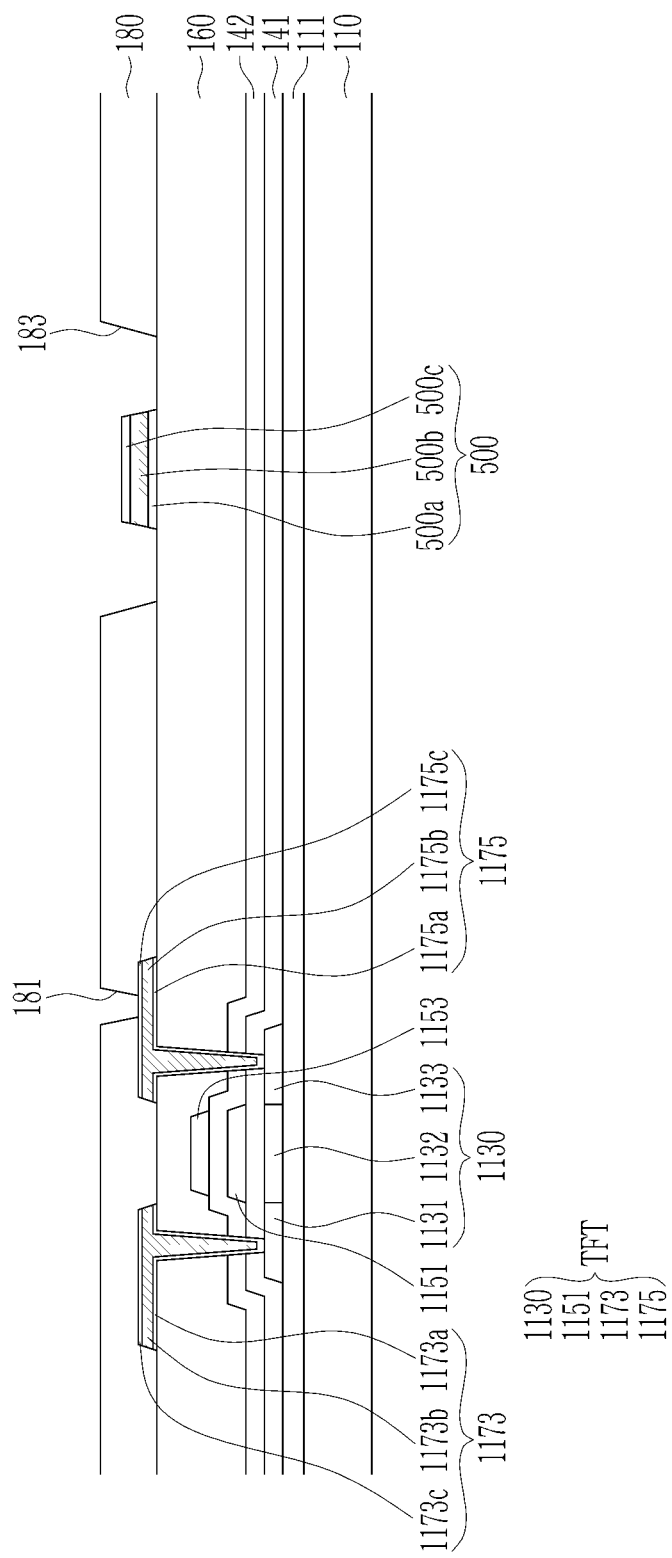

As shown in FIG. 7, the passivation film 180 may be formed by using an organic insulating material on the source electrode 1173, the drain electrode 1175, and the common voltage line 500. For example, the openings 181 and 183 may be formed by patterning the passivation film 180.

At least a portion of the drain electrode 1175 may be exposed by the opening 181. At least a portion of the upper surface of the upper layer 1175c of the drain electrode 1175 may be exposed by the opening 181.

At least a portion of the common voltage line 500 may be exposed by the opening 183. The upper surface of the upper layer 500c, the lower layer 500a, the intermediate layer 500b, and the side surface OS3 of the upper layer 500c of the common voltage line 500 may be exposed by the opening 183. In addition, the upper surface of the interlayer insulating film 160 disposed around the common voltage line 500 may also be exposed by the opening 183.

Figure 8:
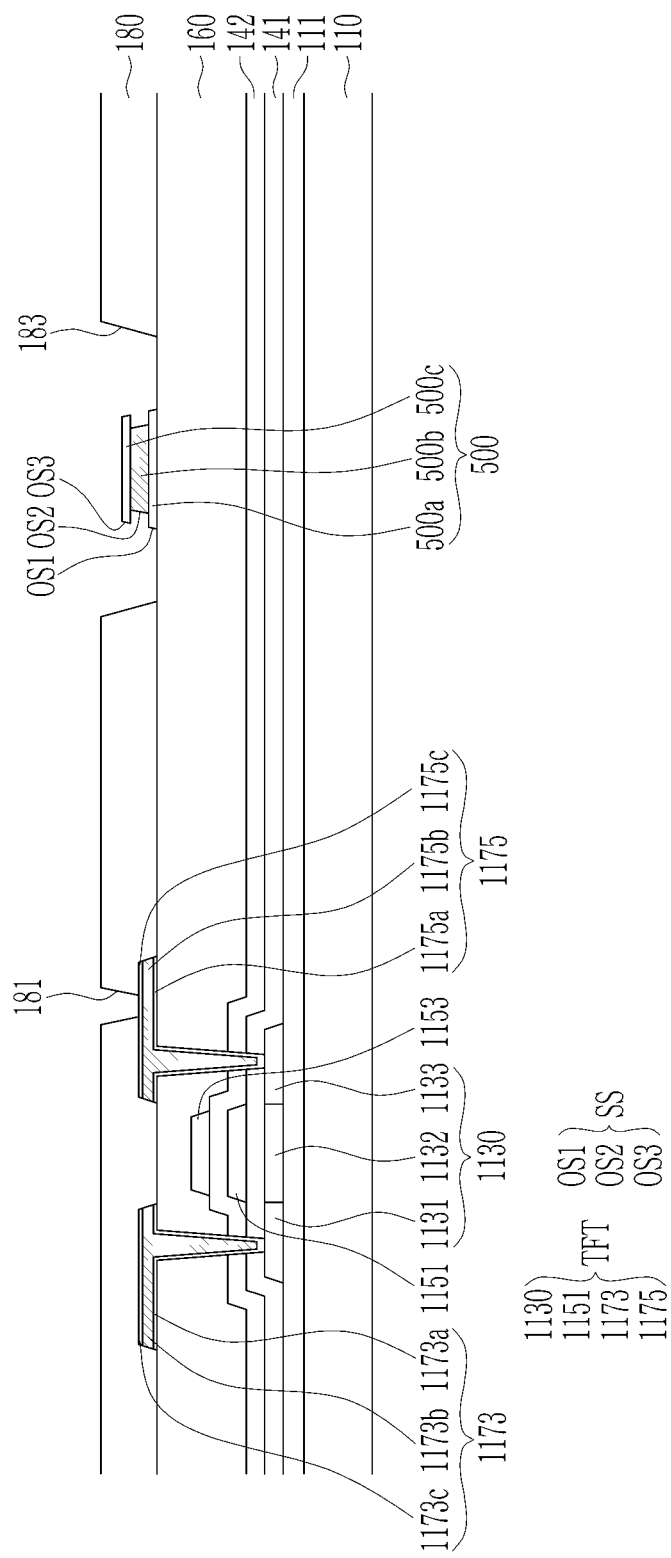

As shown in FIG. 8, the intermediate layer 500b of the common voltage line 500 may be etched. The intermediate layer 500b of the common voltage line 500 may be made of a different material from that of the upper layer 500c and the lower layer 500a of the common voltage line 500. For example, the intermediate layer 500b may be selectively etched by an etchant capable of etching only the intermediate layer 500b in an etching process. Accordingly, the side surface OS2 of the intermediate layer 500b exposed by the opening 183 may be etched, and the width of the intermediate layer 500b may become narrower than that of the upper layer 500c. Accordingly, the side surface OS3 of the upper layer 500c may have a shape that is not aligned with the side surface OS2 of the intermediate layer 500b and protrudes more than the side surface OS2 of the intermediate layer 500b. An edge portion of the lower surface of the upper layer 500c may not contact the upper surface of the intermediate layer 500b. Further, the width of the intermediate layer 500b may be narrower than that of the lower layer 500a. Accordingly, the side surface OS1 of the lower layer 500a may have a shape that is not aligned with the side surface OS2 of the intermediate layer 500b and protrudes more than the side surface OS2 of the intermediate layer 500b. An edge portion of the upper surface of the lower layer 500a may not contact the lower surface of the intermediate layer 500b.

In the step of etching of the intermediate layer 500b of the common voltage line 500, the source electrode 1173 and the drain electrode 1175 may not be etched. Since the source electrode 1173 is entirely covered by the passivation film 180, the source electrode 1173 may not be etched. Since only the upper surface of the upper layer 1175c of the drain electrode 1175 is exposed by the opening 181 and the intermediate layer 1175b of the drain electrode 1175 not exposed by the opening 181, the intermediate layer 1175b of the drain electrode 1175 may not be etched.

Figure 9:
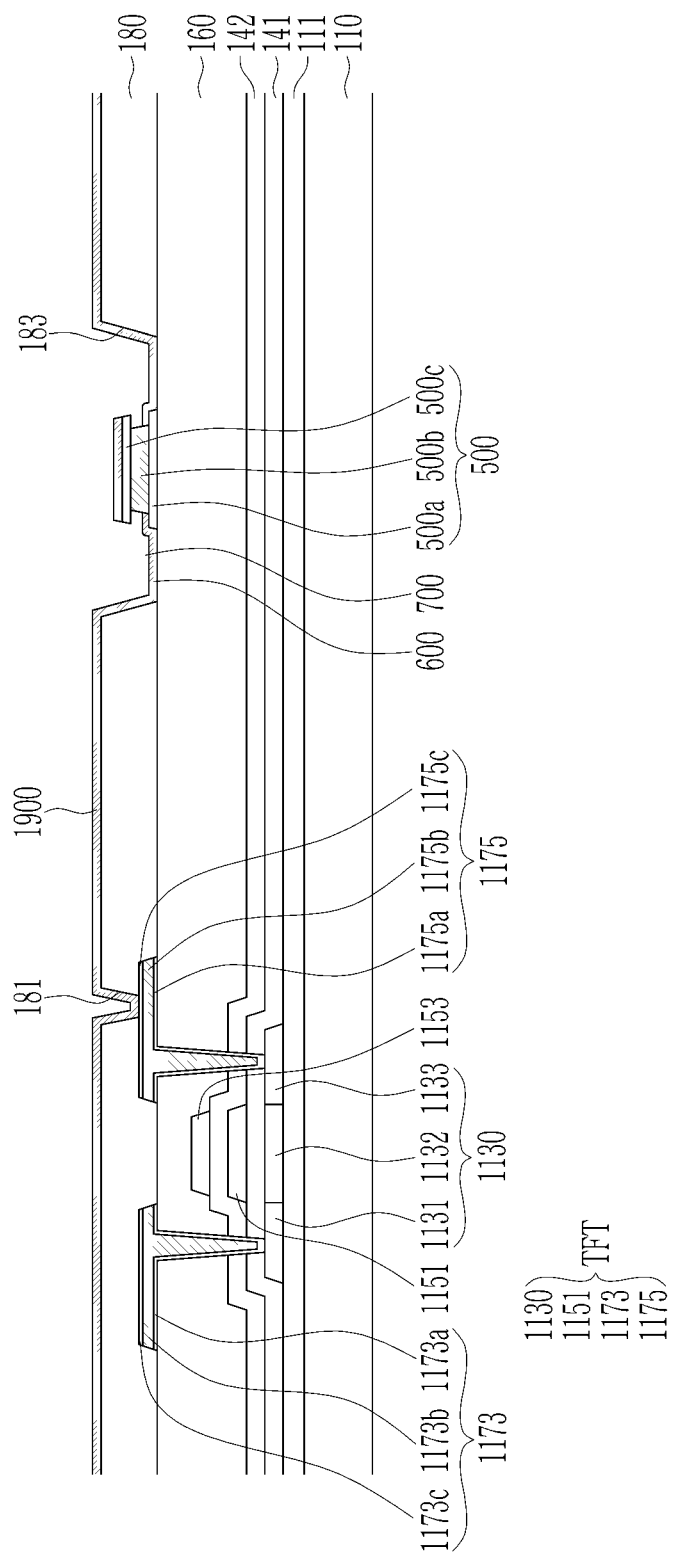

As shown in FIG. 9, a first conductive material layer 1900 may be formed on the passivation film 180. The first conductive material layer 1900 may be formed as a single layer including a transparent conductive oxide film or a metal material, or a multi-layer including the transparent conductive oxide film or the metal material. For example, the first conductive material layer 1900 may be formed by sequentially stacking an ITO, silver (Ag), and an ITO. The first conductive material layer 1900 may be entirely formed on the substrate 110. The first conductive material layer 1900 may be directly disposed on the passivation film 180. It may also be formed in the openings 181 and 183 of the passivation film 180 of the first conductive material layer 1900. In the opening 183 of the passivation film 180, the first conductive material layer 1900 may also be disposed on the common voltage line 500. The first conductive material layer 1900 may be in contact with the upper surface and the side surface OS1 of the lower layer 500a of the common voltage line 500, may be in contact with the side surface OS2 of the intermediate layer 500b, and may be in contact with the upper surface of the upper layer 500c. A portion 1900_1 of the first conductive material layer 1900 contacting the lower layer 500a and the intermediate layer 500b of the common voltage line 500 may be separated or disconnected from a portion 1900_2 of the first conductive material layer 1900 contacting the upper layer 500c of the common voltage line 500.

Figure 10:
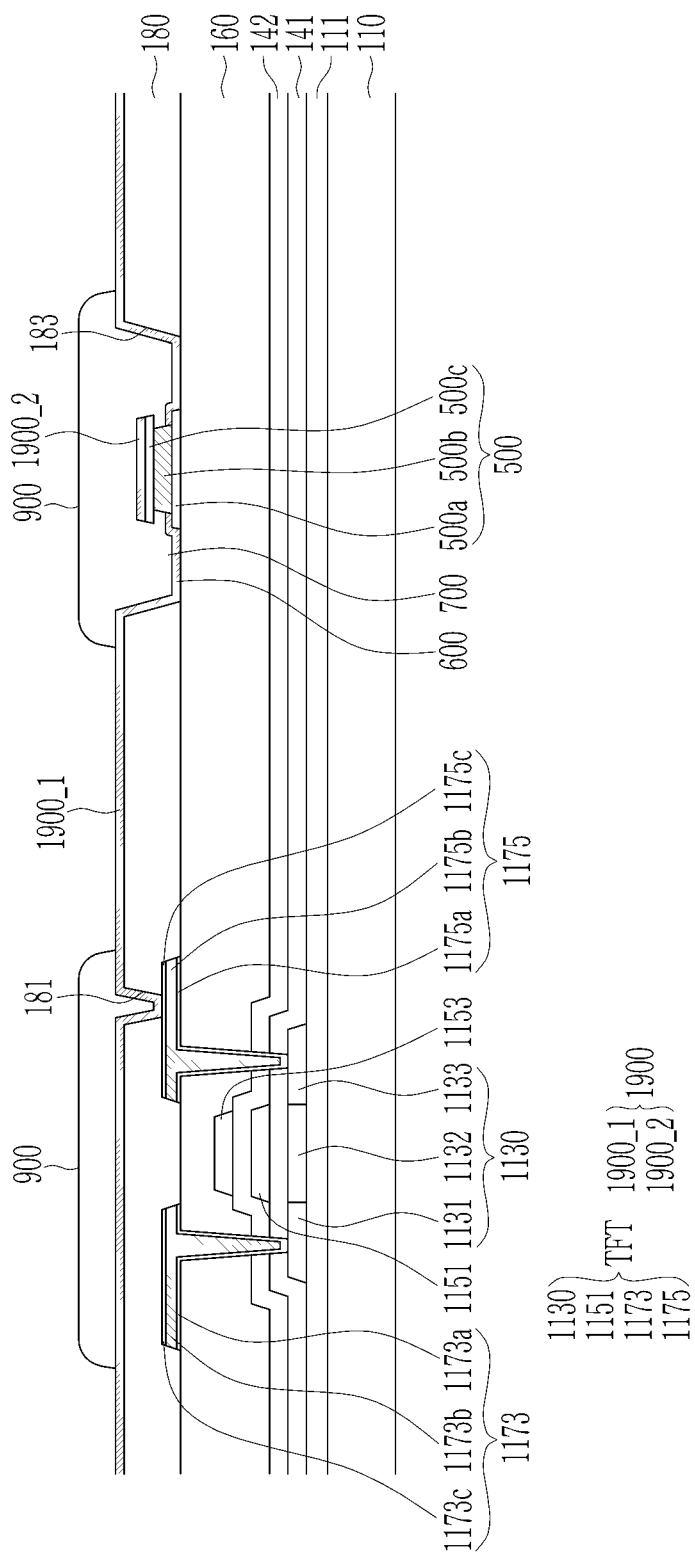

As shown in FIG. 10, a photoresist 900 may be coated on the first conductive material layer 1900, and a photo process may be performed. The photoresist 900 may be a polymer compound that includes all of photosensitivity, adhesion, and corrosion resistance, and properties thereof may be changed when light is irradiated thereon. By patterning the photoresist 900, the photoresist 900 disposed in some areas may be removed. The photoresist 900 disposed in a peripheral area of a connecting portion between the thin film transistor TFT and the first conductive material layer 1900 and in a peripheral area of the common voltage line 500 may remain. The photoresist 900 may be formed to fill the opening 183 of the passivation film 180, and the common voltage line 500 may be entirely covered by the photoresist 900.

Figure 11:
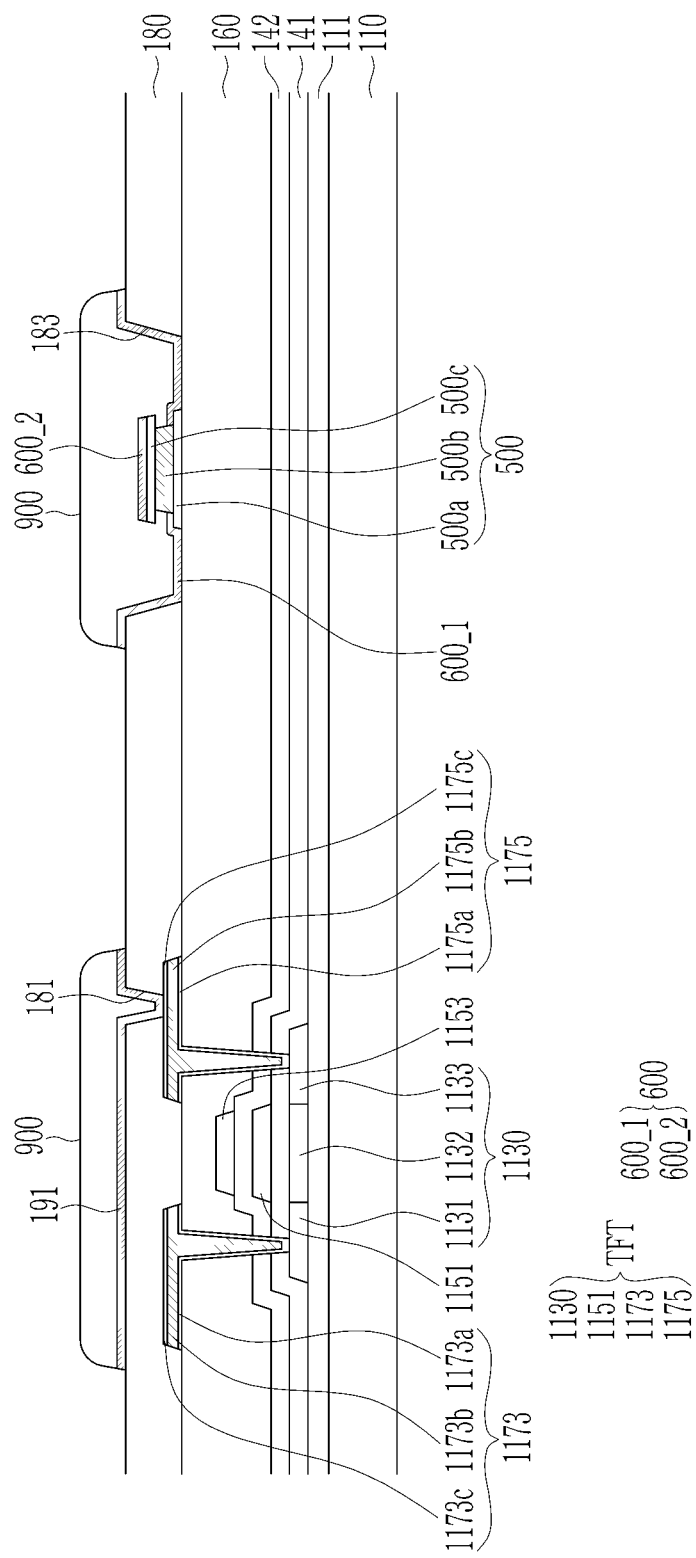

As shown in FIG. 11, the first conductive material layer 1900 may be etched by using the patterned photoresist 900 as a mask. By patterning the first conductive material layer 1900, the first electrode 191 and the first auxiliary electrode 600 may be formed. The first electrode 191 may be connected to the drain electrode 1175 of the thin film transistor TFT through the opening 181 of the passivation film 180. The first auxiliary electrode 600 may be disposed within the opening 183 of the passivation film 180. The first auxiliary electrode 600 may also be disposed on the passivation film 180. The first electrode 191 and the first auxiliary electrode 600 may be disposed on the same layer. The first electrode 191 and the first auxiliary electrode 600 may be made of the same material, and may be formed in the same process.

The first auxiliary electrode 600 may be disposed on the common voltage line 500, and may be in contact with the side surface SS of the common voltage line 500. The first auxiliary electrode 600 may be disposed on the lower layer 500a of the common voltage line 500, and may be in contact with the side surface OS2 of the intermediate layer 500b. The first auxiliary electrode 600 may also be disposed on the upper layer 500c of the common voltage line 500. A portion 600_1 of the first auxiliary electrode 600 in contact with the lower layer 500a and the intermediate layer 500b of the common voltage line 500 may be separated or disconnected from a portion 600_2 of the first auxiliary electrode 600 disposed on the upper layer 500c of the common voltage line 500.

In the step of etching of the first conductive material layer 1900, the common voltage line 500 may be covered by the photoresist 900, so the common voltage line 500 may not be affected by an etchant for etching the first conductive material layer 1900. For example, the common voltage line 500 may be protected by the photoresist 900. Thus, the photoresist 900 may prevent the intermediate layer 500b of the common voltage line 500 from being damaged by the etchant.

Figure 12:
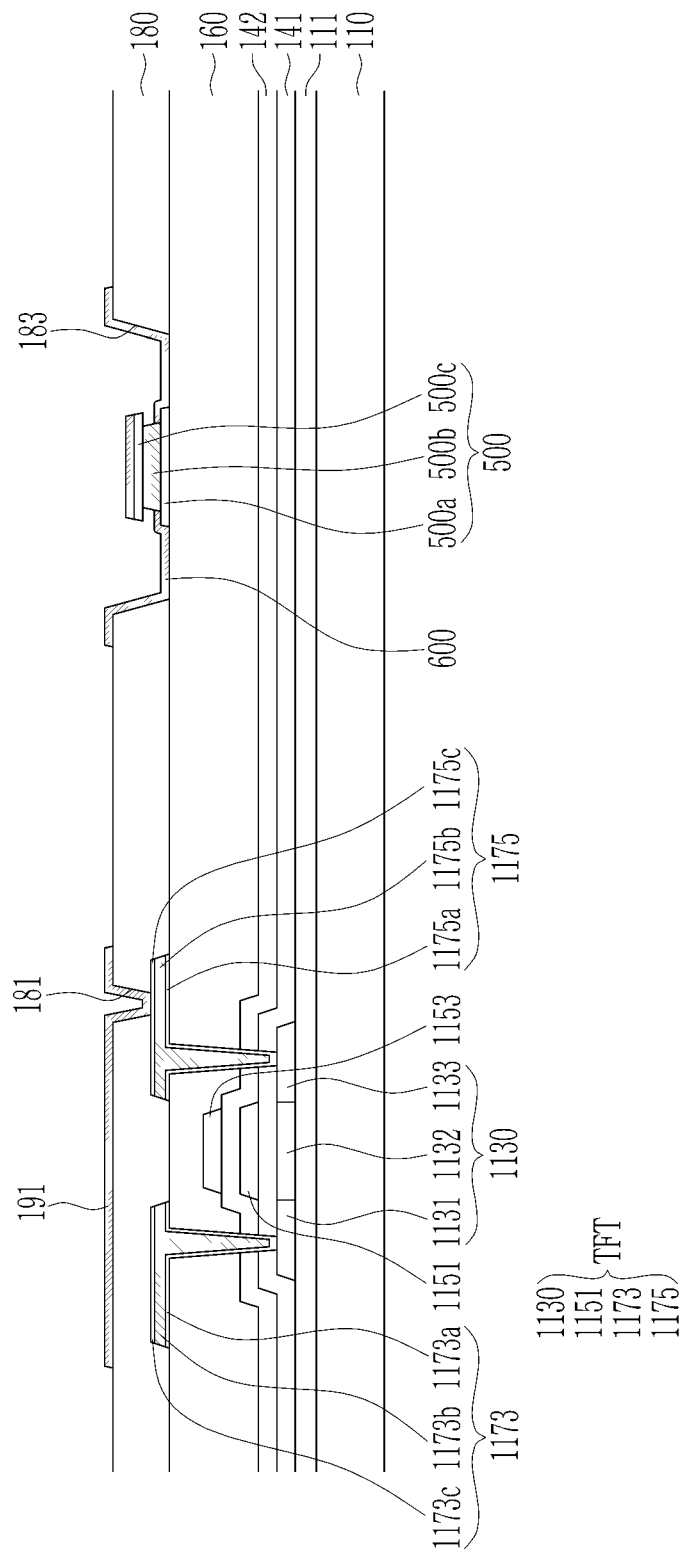

As shown in FIG. 12, all of the patterned photoresist 900 may be removed. Accordingly, the first electrode 191 and the first auxiliary electrode 600 disposed under the photoresist 900 may be exposed.

Figure 13:
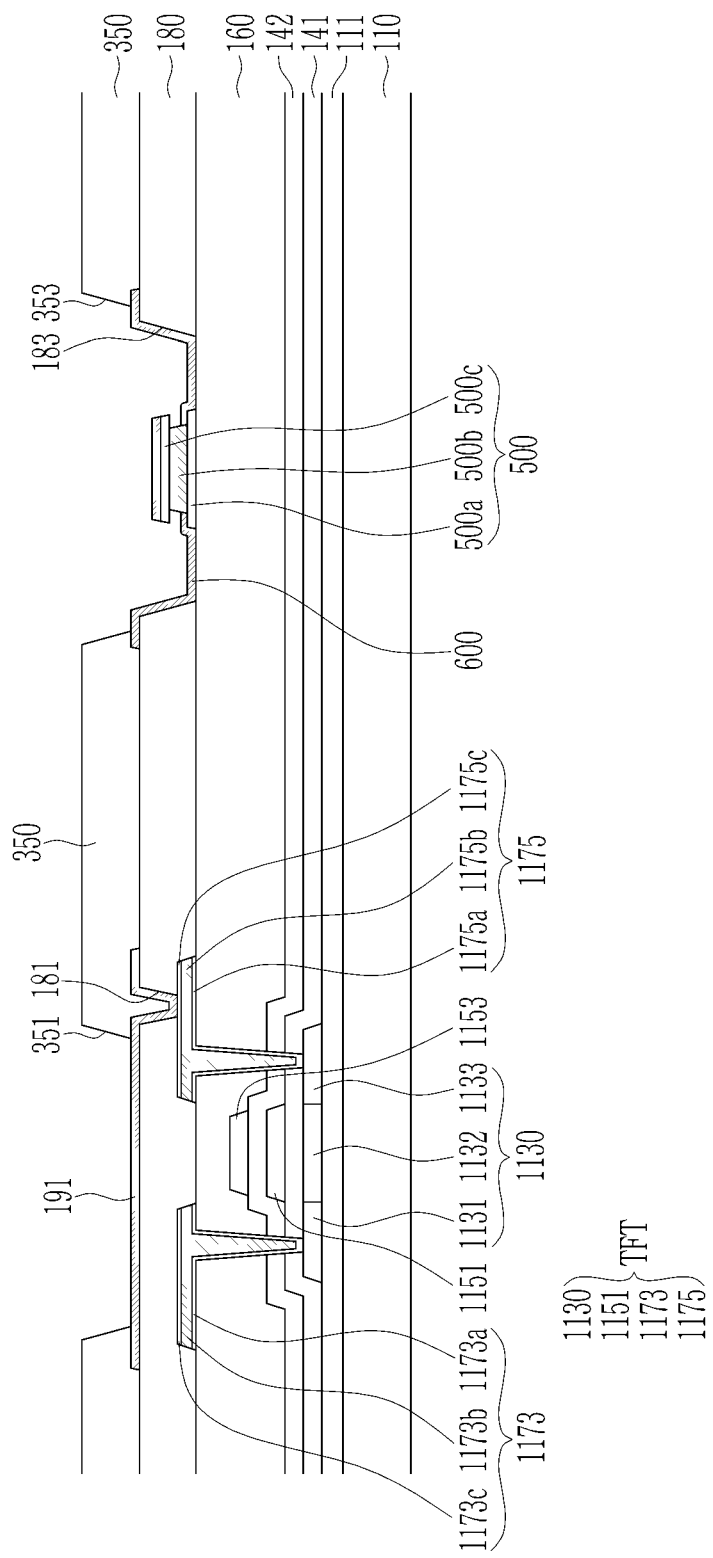

As shown in FIG. 13, the bank layer 350 may be formed on the first electrode 191, the first auxiliary electrode 600, and the passivation film 180 by using an organic insulating material. The bank layer 350 may be patterned to form the pixel opening 351 and the opening 353. The pixel opening 351 may overlap the first electrode 191. For example, the first electrode 191 may be exposed by the pixel opening 351. The opening 353 may overlap the common voltage line 500. For example, the common voltage line 500 may be exposed by the opening 353. The opening 353 of the bank layer 350 may also overlap the opening 183 of the passivation film 180. The opening 353 of the bank layer 350 may have a wider width than the opening 183 of the passivation film 180. The size of the opening 353 of the bank layer 350 may be larger than the size of the common voltage line 500.

Figure 14:
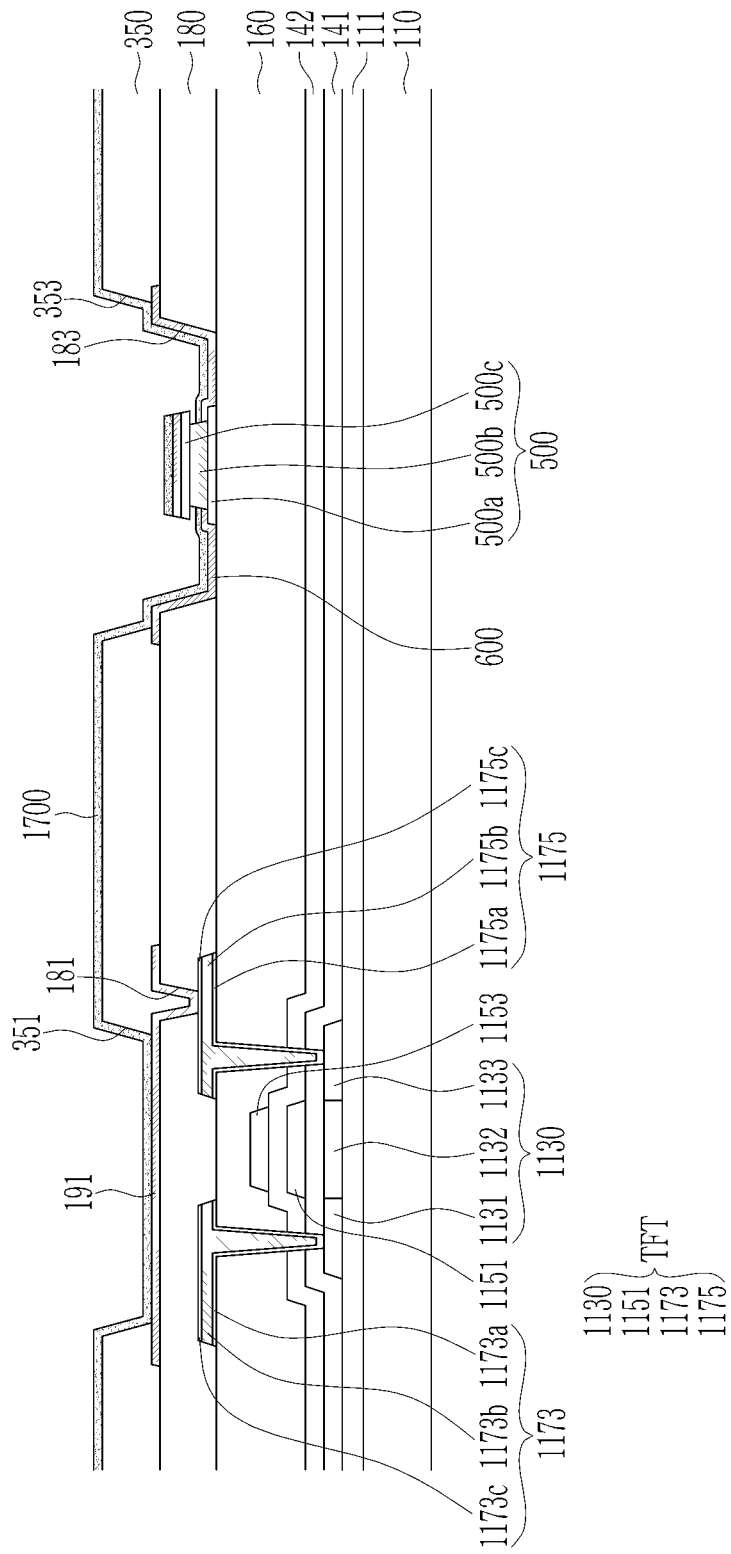

As shown in FIG. 14, a second conductive material layer 1700 may be formed on the first electrode 191, the first auxiliary electrode 600, and the bank layer 350. The second conductive material layer 1700 may be formed of a transparent conductive oxide film such as an indium tin oxide (ITO), a poly-ITO, an indium zinc oxide (IZO), an indium gallium zinc oxide (IGZO), and an indium tin zinc oxide (ITZO). The second conductive material layer 1700 may be entirely formed on the substrate 110. The second conductive material layer 1700 may also be formed in the pixel opening 351 and the opening 353 of the bank layer 350.

Figure 15:
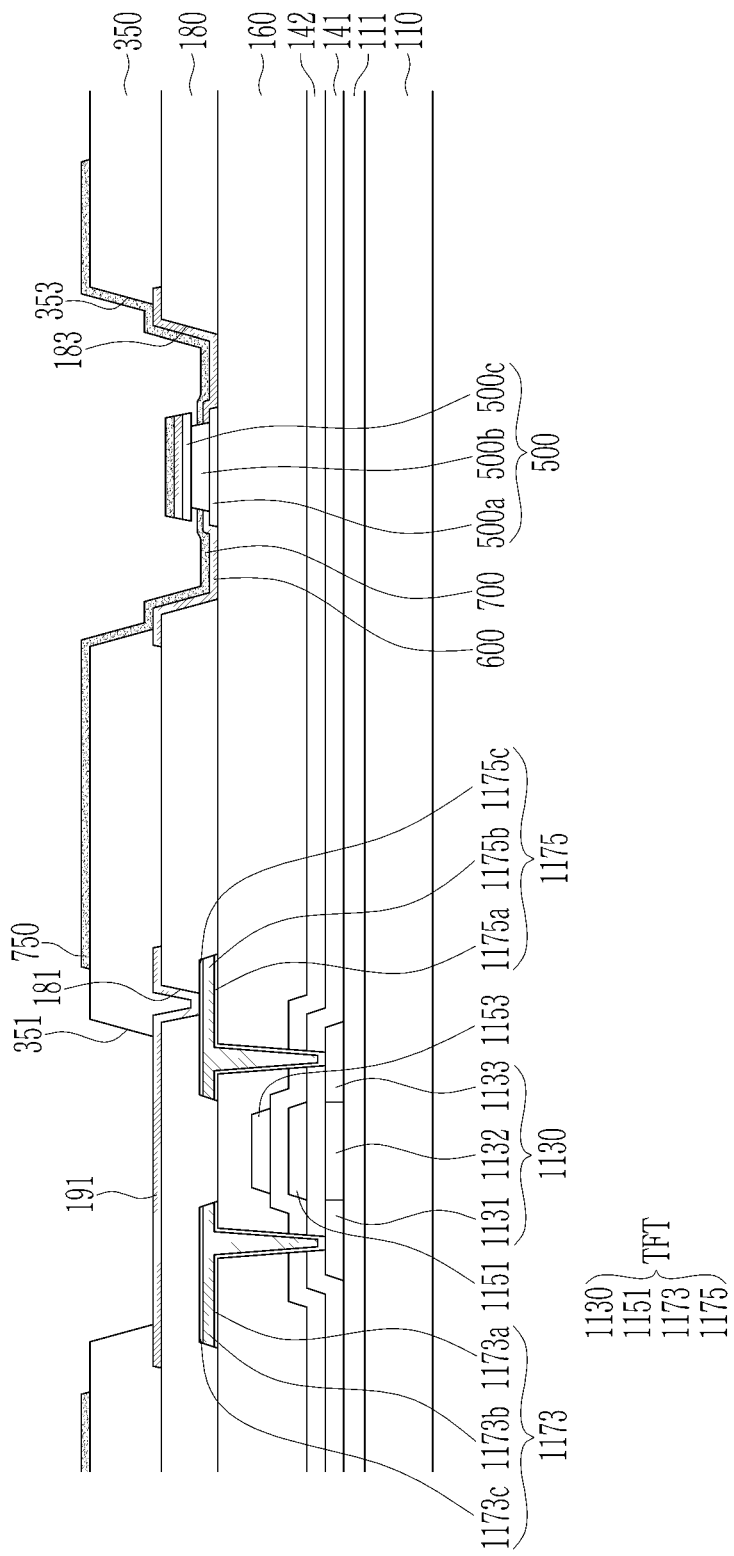

As shown in FIG. 15, the separator layer 750 and the second auxiliary electrode 700 may be formed by patterning the second conductive material layer 1700. The separator layer 750 and the second auxiliary electrode 700 may be disposed on the same layer. The separator layer 750 and the second auxiliary electrode 700 may be made of the same material, and may be formed in the same process.

The separator layer 750 may be formed to surround the pixel opening 351 of the bank layer 350. An edge of the separator layer 750 may be adjacent to the pixel opening 351 of the bank layer 350. In this case, the edge of the separator layer 750 may be disposed outside the pixel opening 351 of the bank layer 350. A lower surface of the separator layer 750 may be in contact with an upper surface of the bank layer 350.

The second auxiliary electrode 700 may be in contact with the upper surface of the first auxiliary electrode 600, and may be in contact with the side surface SS of the common voltage line 500. The second auxiliary electrode 700 may be in contact with the side surface SS of the intermediate layer 500b of the common voltage line 500. The second auxiliary electrode 700 may also be disposed on the upper layer 500c of the common voltage line 500. A portion of the second auxiliary electrode 700, which is in contact with the side surface OS2 of the intermediate layer 500b of the common voltage line 500, may be separated or disconnected from a portion of the second auxiliary electrode 700 disposed on the upper layer 500c of the common voltage line 500.

Figure 16:
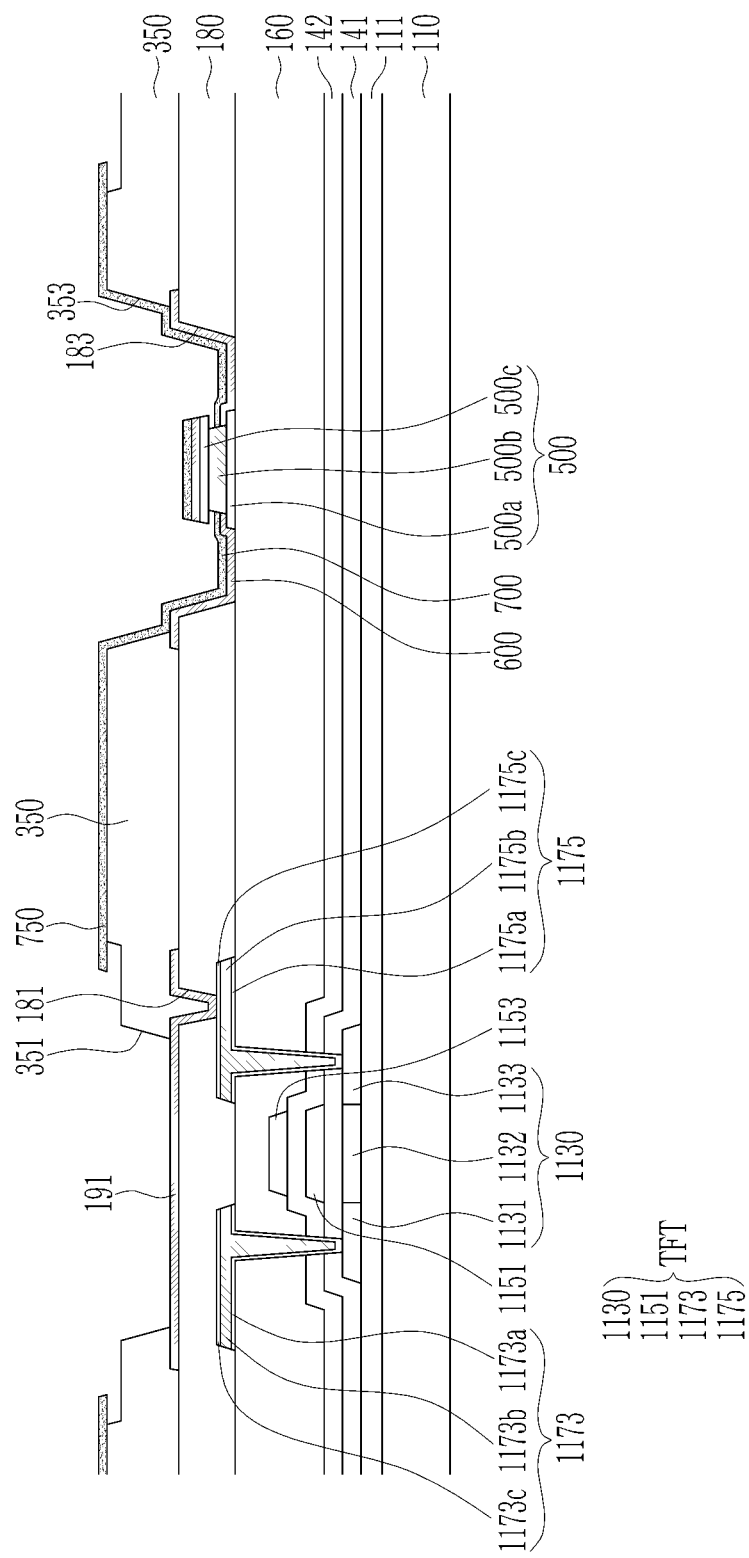

As shown in FIG. 16, the thickness of a portion of the bank layer 350 may be reduced by performing an ashing process. Most of the bank layer 350 may be covered by the separator layer 750 and the second auxiliary electrode 700. A portion of the bank layer 350 disposed around the pixel opening 351 may not be covered by the separator layer 750, but is exposed. The portion of the bank layer 350 disposed around the pixel opening 351 may be removed by an ashing process. Accordingly, the thickness of a portion of the bank layer 350 adjacent to the edge of the separator layer 750 may be thinner than that of other portions thereof. A lower surface of the edge of the separator layer 750 may not contact an upper surface of the bank layer 350.

Figure 17:
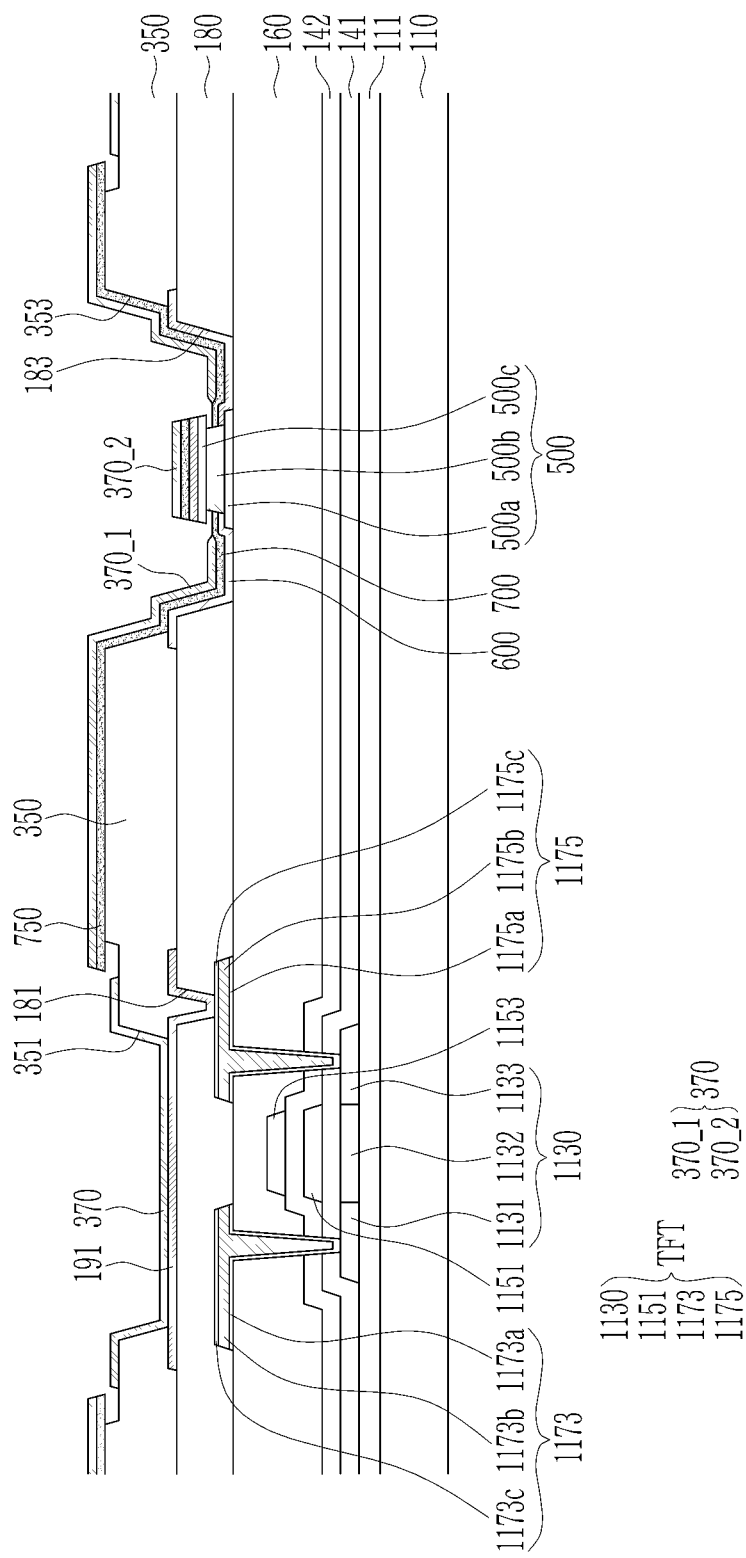

As shown in FIG. 17, the emission layer 370 may be formed on the first electrode 191, the separator layer 750, and the second auxiliary electrode 700. The emission layer 370 may be formed by sequentially depositing a plurality of layers. Some of the plurality of layers may be formed to be disposed only within the pixel opening 351, and others of the plurality of layers may be entirely formed on the substrate 110. However, embodiments are not limited thereto, and the plurality of layers may be entirely formed on the substrate 110. When the emission layer 370 includes a plurality of light emitting units, the charge generating layer may be disposed between the plurality of light emitting units.

A portion of the emission layer 370 disposed on the first electrode 191 may be separated or disconnected from other portions of the emission layer 370 disposed on the remaining portions other than the first electrode. The emission layer 370 may be divided in the edge portion of the pixel opening 351 by the separator layer 750. The emission layer 370 may be formed as a plurality of layers, some layers of the emission layer 370 may be divided in the edge portion of the pixel opening 351, and some other layers may be connected.

The emission layer 370 may also be disposed on the second auxiliary electrode 700 and the upper layer 500c of the common voltage line 500. A portion 370_1 of the emission layer 370 disposed on the second auxiliary electrode 700 may be separated or disconnected from a portion 370_2 of the emission layer 370 disposed on the upper layer 500c of the common voltage line 500. The emission layer 370 may be divided in the edge portion of the common voltage line 500. The emission layer 370 may be formed as a plurality of layers, and all layers of the emission layer 370 may be divided in the edge portion of the common voltage line 500. The side surface SS of the common voltage line 500 may not be covered by the emission layer 370. Further, at least a portion of the edge of the second auxiliary electrode 700 may not be covered by the emission layer 370.

Figure 18:
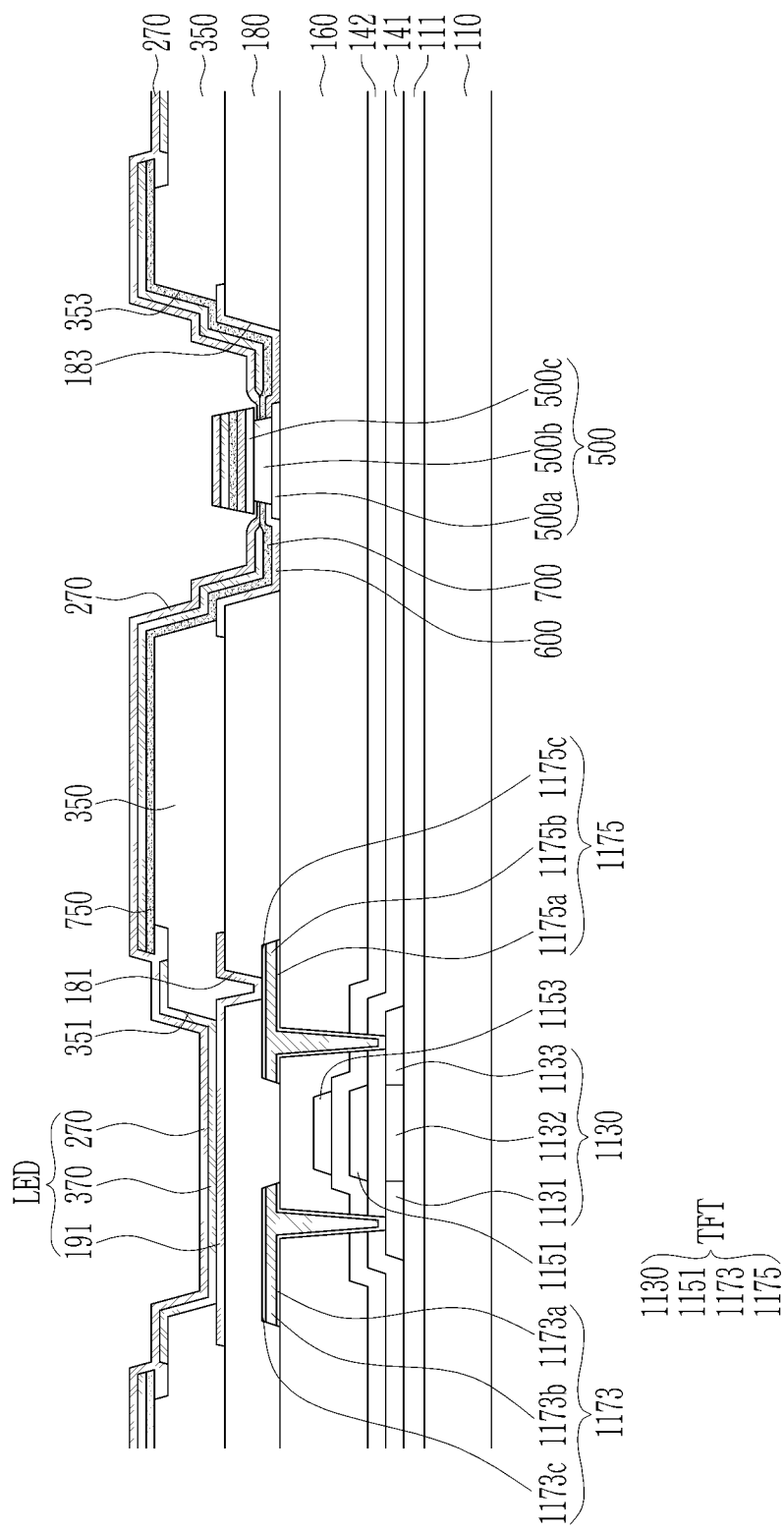

As shown in FIG. 18, the second electrode 270 may be formed by using a conductive material on the emission layer 370. The second electrode 270 may be formed of a transparent conductive oxide layer or a translucent conductive material.

The second electrode 270 may be directly disposed on the emission layer 370, and may be entirely formed on the substrate 110. The second electrode 270 may be connected to the common voltage line 500. The common voltage ELVSS may be applied to the second electrode 270 and the common voltage line 500. Accordingly, it is possible to prevent a voltage drop from occurring even if the second electrode 270 is not smoothly connected in some areas.

The second electrode 270 may be in contact with the side surface SS (OS1, OS2, and OS3 in FIG. 2) of the common voltage line 500. The second electrode 270 may or may not be in direct contact with the side surface SS of the common voltage line 500. The first auxiliary electrode 600 and the second auxiliary electrode 700 may be disposed between the second electrode 270 and the common voltage line 500. The first auxiliary electrode 600 may be in contact with the side surface SS of the intermediate layer 500b of the common voltage line 500, and the second auxiliary electrode 700 may be disposed on the first auxiliary electrode 600. The second electrode 270 may be in contact with the second auxiliary electrode 700. In a portion in which the first auxiliary electrode 600 and the side surface SS of the common voltage line 500 contact each other, a first inclination angle θ1 of a first side surface IS1 of the first auxiliary electrode 600 may be smaller than a second inclination angle θ2 of a side surface OS2 of the common voltage line 500, and a third inclination angle θ3 of a second side surface IS2 of the second auxiliary electrode 700 may be smaller than the first inclination angle θ1 of the first side surface IS1 of the first auxiliary electrode 600 (see FIG. 2). Therefore, the second electrode 270 and the common voltage line 500 may be smoothly connected by the first auxiliary electrode 600 and the second auxiliary electrode 700, and the voltage drop of the common voltage ELVSS in the second electrode 270 may be reduced of prevented, and a display device with substantially uniform luminance as a whole may be achieved.

Hereinafter, a display device according to an embodiment will be described with reference to FIG. 19.

Figure 19:
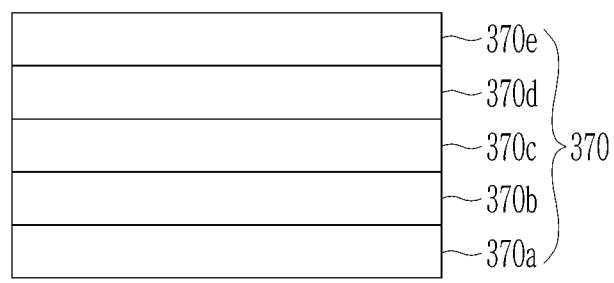
FIG. 19 illustrates a cross-sectional view of another embodiment of the emission layer of the display device of FIG. 1.

Since many portions of the display device of FIG. 19 are the same as those of the display device of FIG. 1, duplicative descriptions will be omitted to avoid redundancy. The illustrated embodiment is different from the previously described embodiment of FIG. 1 in that the emission layer is formed of a single light emitting unit, which will be further described below.

FIG. 19 illustrates a cross-sectional view of another embodiment of the emission layer of the display device of FIG. 1. FIG. 19 illustrates a plurality of layers configuring an emission layer of a display device according to an embodiment.

As shown in FIG. 19, the display device may include the emission layer 370. In the previous embodiment, the emission layer 370 may include a plurality of light emitting units and a charge generating layer disposed between them, and in the illustrated embodiment, the emission layer 370 may be formed of a single light emitting unit.

The emission layer 370 may include an electron injection layer 370a, an electron transporting layer 370b, an organic emission layer 370c, a hole transporting layer 370d, and a hole injection layer 370e. The organic emission layer 370c may include a low molecular weight or high molecular weight organic material that emits light such as red light, green light, and blue light. In another embodiment, at least some of the electron injection layer 370a, the electron transporting layer 370b, the hole transporting layer 370d, and the hole injection layer 370e may be omitted. The electron injection layer 370a may be in contact with the first electrode. The hole injection layer 370e may be in contact with the second electrode.

In the illustrated embodiment, the emission layer 370 may not include a charge generating layer.

Hereinafter, a display device according to an embodiment will be described with reference to FIG. 20.

Figure 20:
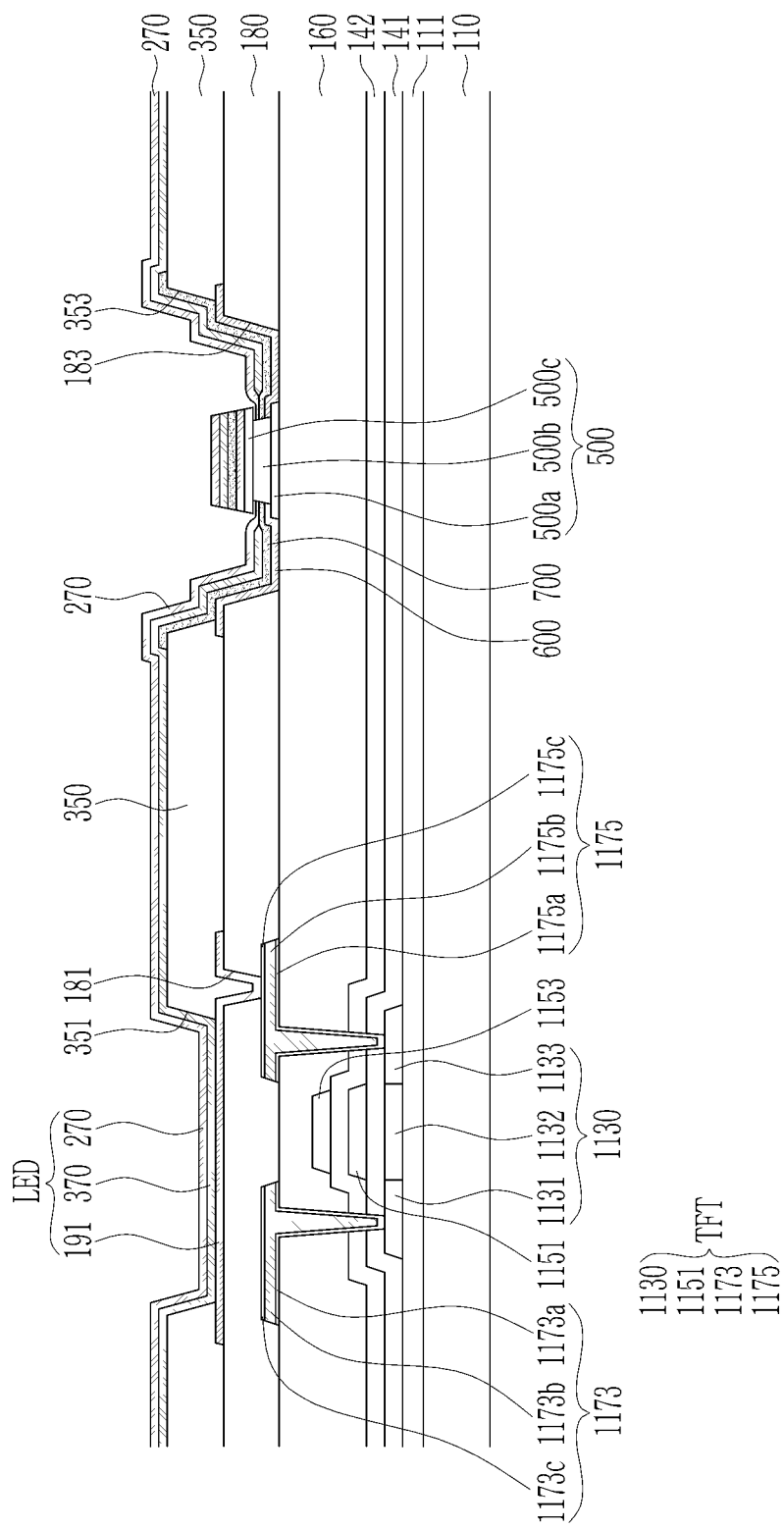
FIG. 20 illustrates a cross-sectional view of another embodiment of a display device constructed according to the principles of the invention.

Since many portions of the display device of FIG. 20 are the same as those of the display device of FIG. 1 duplicative descriptions will be omitted to avoid redundancy. The illustrated embodiment is different from the previously described embodiment of FIG. 1 in that the separator layer is omitted, which will be further described below.

FIG. 20 illustrates a cross-sectional view of another embodiment of the display device of FIG. 1.

As shown in FIG. 20, the display device may include the substrate 110, the transistor TFT, the first electrode 191, the emission layer 370, the second electrode 270, the common voltage line 500, the first auxiliary electrode 600, and the second auxiliary electrode 700.

In the previous embodiment, the separator layer 750 may be further included, and the emission layer 370 may be divided in at least a partial area by the separator layer 750. In the illustrated embodiment, the separator layer 750 may be omitted.

The emission layer 370 is not divided in the edge portion of the pixel opening 351, but may have a connected structure. The emission layer 370 may be formed of a single light emitting unit, and may not include a charge generating layer. The thickness of a portion of the bank layer 350 adjacent to the pixel opening 351 may be substantially the same as that of other portions of the bank layer 350. For example, the thickness of the bank layer 350 may be uniform as a whole.

The second auxiliary electrode 700 may be disposed on the first auxiliary electrode 600 and the bank layer 350. However, embodiments are not limited thereto, and the second auxiliary electrode 700 may not be disposed on the bank layer 350. The second auxiliary electrode 700 may entirely cover the first auxiliary electrode 600. However, embodiments are not limited thereto, and the second auxiliary electrode 700 may cover a portion of the first auxiliary electrode 600.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a substrate;
a transistor disposed on the substrate;
a first electrode connected to the transistor;
an emission layer disposed on the first electrode;
a second electrode disposed on the emission layer;
a common voltage line connected to the second electrode; and
a third electrode and a fourth electrode disposed between, and electrically connected to the common voltage line and the second electrode, wherein
the common voltage line includes a bottom surface facing the substrate, a top surface opposite the bottom surface and facing away from the substrate, and a side surface connecting the top surface and the bottom surface;
the third electrode comprises a first auxiliary electrode in direct contact with the side surface of the common voltage line.

2. The display device of claim 1, wherein
a distil end of the third electrode is in direct contact with the side surface of the common voltage line, and
the fourth electrode comprises a second auxiliary electrode disposed on the first auxiliary electrode.

3. The display device of claim 2, wherein:
the first auxiliary electrode includes a first inclined surface adjacent to the side surface of the common voltage line; and
the second auxiliary electrode includes a second inclined surface adjacent to the first inclined surface of the first auxiliary electrode, and wherein:
the first inclined surface of the first auxiliary electrode is disposed at a first inclination angle, the side surface of the common voltage line is disposed at a second inclination angle, the first inclination angle being smaller than the second inclination angle, and
the second inclined surface of the second auxiliary electrode is disposed at a third inclination angle smaller than the second inclination angle.

4. The display device of claim 3, wherein
the second electrode is in contact with the second auxiliary electrode.

5. The display device of claim 1, wherein the common voltage line comprises:
a lower layer,
an intermediate layer disposed on the lower layer, and
an upper layer disposed on the intermediate layer, and the upper layer has a width wider than that of the intermediate layer.

6. The display device of claim 5, wherein:
the third electrode is in contact with a side surface of the intermediate layer, and
the fourth electrode is disposed on the third electrode.

7. The display device of claim 6, wherein, the lower layer has a width wider than that of the intermediate layer.

8. The display device of claim 1, further comprising:
a first layer disposed on the first electrode, the first layer including a pixel opening overlapping the first electrode, and
a second layer disposed on the first layer,
wherein a second auxiliary electrode and the second layer are disposed on a same layer.

9. The display device of claim 8, wherein:
the first layer comprises a bank layer having an upper surface,
the second layer comprises a separator layer having an edge adjacent to the pixel opening of the bank layer, and
the edge of the separator layer has a lower surface adjacent to the pixel opening and not in contact with the upper surface of the bank layer.

10. The display device of claim 9, wherein the lower surface of the edge of the separator layer adjacent to the pixel opening is in contact with the second electrode.

11. The display device of claim 10, wherein a portion of the bank layer adjacent to the pixel opening has a thickness thinner than that of the remaining portion of the bank layer.

12. The display device of claim 8, wherein the second auxiliary electrode is connected to the second layer.

13. The display device of claim 8, wherein a portion of the emission layer overlapping the second layer and a portion of the emission layer not overlapping the second layer are separated from each other.

14. The display device of claim 8, wherein a portion of the emission layer overlapping the common voltage line and a portion of the emission layer not overlapping the common voltage line are separated from each other.

15. The display device of claim 8, wherein a portion of the second electrode overlapping the second layer and a portion of the second electrode not overlapping the second layer are connected to each other.

16. The display device of claim 8, wherein a portion of the second electrode overlapping the common voltage line and a portion of the second electrode not overlapping the common voltage line are separated from each other.

17. The display device of claim 8, wherein the emission layer comprises:
a plurality of light emitting units, and
a charge generating layer disposed between the plurality of light emitting units.

18. The display device of claim 1, wherein the transistor comprises:
a semiconductor disposed on the substrate,
a gate electrode overlapping the semiconductor, and
a source electrode and a drain electrode connected to the semiconductor, and
wherein the common voltage line, the source electrode, and the drain electrode are disposed on a same layer.

19. The display device of claim 1, wherein the third electrode and the first electrode are formed of a same material.

20. A method of manufacturing a display device, the method comprising the steps of:
forming a transistor on a substrate;
forming a common voltage line spaced apart from the transistor on the substrate;
forming a first electrode connected to the transistor;
forming a third electrode electrically connected to the common voltage line;
forming a fourth electrode on and electrically connected to the third electrode;
forming an emission layer on the first electrode; and
forming a second electrode on the emission layer and the fourth electrode, wherein
the common voltage line includes a bottom surface facing the substrate, a top surface opposite the bottom surface and facing away from the substrate, and a side surface connecting the top surface and the bottom surface:
the third electrode comprises a first auxiliary electrode in direct contact with the side surface of the common voltage line.

21. The method of claim 20, wherein a distil end of the third electrode is in direct contact with the side surface of the common voltage line.

22. The method of claim 20, wherein:
the third electrode comprises a first auxiliary electrode having a first inclined surface adjacent to a side surface of the common voltage line; and
the fourth electrode comprises a second auxiliary electrode having a second inclined surface adjacent to the first inclined surface of the first auxiliary electrode, and wherein:
the first inclined surface of the first auxiliary electrode is disposed at a first inclination angle,
the side surface of the common voltage line is disposed at a second inclination angle, the first inclination angle being smaller than the second inclination angle, and
the second inclined surface of the second auxiliary electrode is disposed at a third inclination angle smaller than the first inclination angle.

23. The method of claim 22, wherein the second electrode is in contact with the second auxiliary electrode.

24. The method of claim 20, wherein the common voltage line comprises:
a lower layer,
an intermediate layer disposed on the lower layer, and
an upper layer disposed on the intermediate layer, and
the intermediate layer is made of a different material from that of the upper layer, and
the intermediate layer has a width that becomes narrower than that of the upper layer by etching the intermediate layer after forming the common voltage line.

25. The method of claim 24, wherein the third electrode is in contact with a side surface of the intermediate layer.

26. The method of claim 25, wherein:
the intermediate layer is made of a different material from that of the lower layer, and
the intermediate layer has a width that becomes narrower than that of the lower layer by an etching process of the intermediate layer.

27. The method of claim 20, further comprising the steps of:
forming a first layer on the first electrode;
forming a pixel opening overlapping the first electrode in the first layer;
forming a second layer on the first layer; and
performing an ashing process on the first layer to remove a portion of the first layer disposed below the second layer, wherein the fourth electrode and the second layer are made of a same material and are formed by a same process.

28. The method of claim 27, wherein the emission layer comprises:
a plurality of light emitting units, and
a charge generating layer disposed between the plurality of light emitting units.

29. The method of claim 20, wherein the transistor comprises:
a semiconductor disposed on the substrate,
a gate electrode overlapping the semiconductor, and
a source electrode and a drain electrode connected to the semiconductor, and
the common voltage line and the source electrode and the drain electrode are made of a same material and are formed by a same process.

30. The method of claim 20, wherein the third electrode and the first electrode are made of a same material and are formed by a same process.

* * * * *

UNITED STATES PATENT AND TRADEMARK OFFICE
CERTIFICATE OF CORRECTION

PATENT NO. : 12,245,475 B2  
APPLICATION NO. : 17/687702  
DATED : March 4, 2025  
INVENTOR(S) : Cha et al.

Page 1 of 1

It is certified that error appears in the above-identified patent and that said Letters Patent is hereby corrected as shown below:

In the Claims

Column 24, In Claim 2, Line 2, replace "distil" with -- distal --.

Column 26, In Claim 21, Line 1, replace "distil" with -- distal --.

Signed and Sealed this  
Third Day of June, 2025

Coke Morgan Stewart  
*Acting Director of the United States Patent and Trademark Office*